(12) United States Patent
Yokoi

(10) Patent No.: US 12,051,631 B2
(45) Date of Patent: Jul. 30, 2024

(54) STACKED SEMICONDUCTOR DEVICE WITH REMOVABLE PROBE PADS

(71) Applicant: MICRON TECHNOLOGY, INC., Boise, ID (US)

(72) Inventor: Naoki Yokoi, Higashihiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 34 days.

(21) Appl. No.: 17/165,799

(22) Filed: Feb. 2, 2021

(65) Prior Publication Data

US 2022/0246484 A1    Aug. 4, 2022

(51) Int. Cl.
| | |
|---|---|
| *H01L 25/00* | (2006.01) |
| *H01L 21/66* | (2006.01) |
| *H01L 23/00* | (2006.01) |
| *H01L 23/522* | (2006.01) |
| *H01L 25/065* | (2023.01) |

(52) U.S. Cl.
CPC .......... *H01L 22/32* (2013.01); *H01L 23/5226* (2013.01); *H01L 24/03* (2013.01); *H01L 24/05* (2013.01); *H01L 2224/0384* (2013.01); *H01L 2224/0392* (2013.01); *H01L 2224/0557* (2013.01)

(58) Field of Classification Search
CPC ................... H01L 23/481; H01L 24/80; H01L 2224/08145; H01L 2224/80895; H01L 25/0657

See application file for complete search history.

(56) References Cited

U.S. PATENT DOCUMENTS

| | | | |
|---|---|---|---|
| 2017/0053902 A1* | 2/2017 | Yu | H01L 23/481 |
| 2019/0355696 A1* | 11/2019 | Liu | H01L 24/80 |
| 2022/0165664 A1* | 5/2022 | Chang | H01L 23/585 |

* cited by examiner

*Primary Examiner* — Kretelia Graham
*Assistant Examiner* — David J Goodwin
(74) *Attorney, Agent, or Firm* — Dorsey & Whitney LLP

(57) ABSTRACT

Disclosed herein is a method that includes forming a contact plug to be embedded in a first insulating film formed on a semiconductor substrate; forming a probe pad on the first insulating film to contact with the contact plug; performing a test operation by probing the probe pad; removing the probe pad; forming a second insulating film to cover the contact plug after removing the probe pad; and forming a pad electrode to be embedded in the second insulating film.

17 Claims, 30 Drawing Sheets

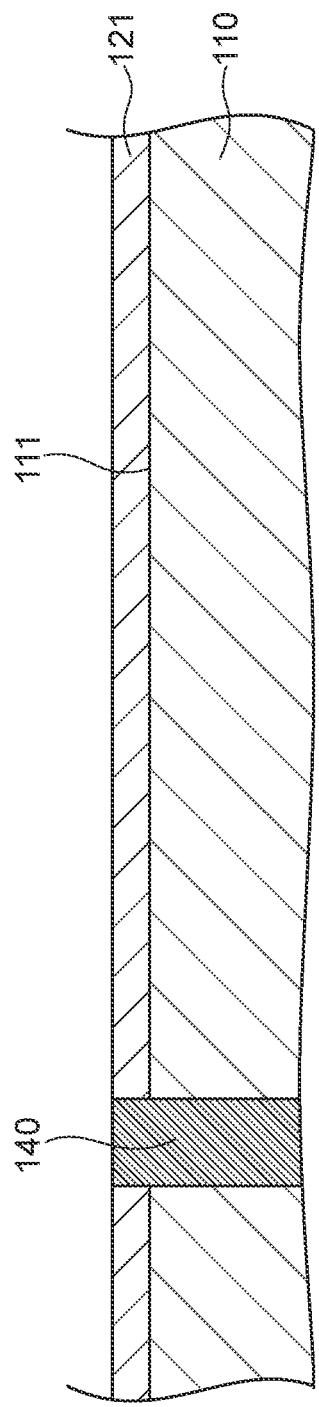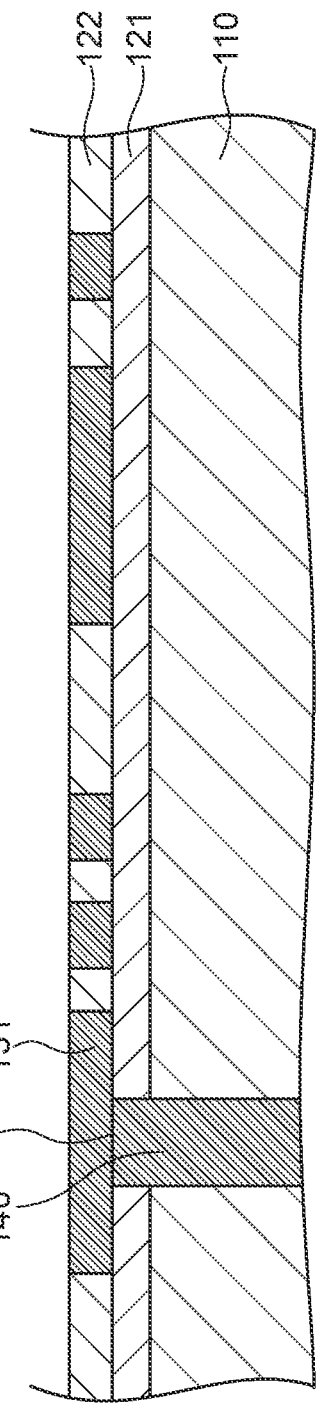

STACKED SEMICONDUCTOR DEVICE WITH REMOVABLE PROBE PADS

BACKGROUND

There are known methods of connecting semiconductor chips that are stacked three-dimensionally, including a method of connecting semiconductor chips via solder bumps, direct bonding that directly bonds pad electrodes of upper and lower semiconductor chips to each other without solder, and hybrid bonding that bonds not only pad electrodes of upper and lower semiconductor chips but also insulating films located on outermost surfaces of the upper and lower semiconductor chips to each other. In order to enable hybrid bonding, a bonding surface of each semiconductor chip needs to be flat. However, when a semiconductor chip is subjected to probing in a test process, there is a problem that a probe mark is formed on a probe pad and it leads to impairing flatness of the bonding surface of the semiconductor chip.

BRIEF DESCRIPTION OF THE DRAWINGS

FIGS. 3 to 17 are process diagrams for explaining a method of manufacturing the semiconductor device according to the first embodiment;

DETAILED DESCRIPTION

Figure 1:
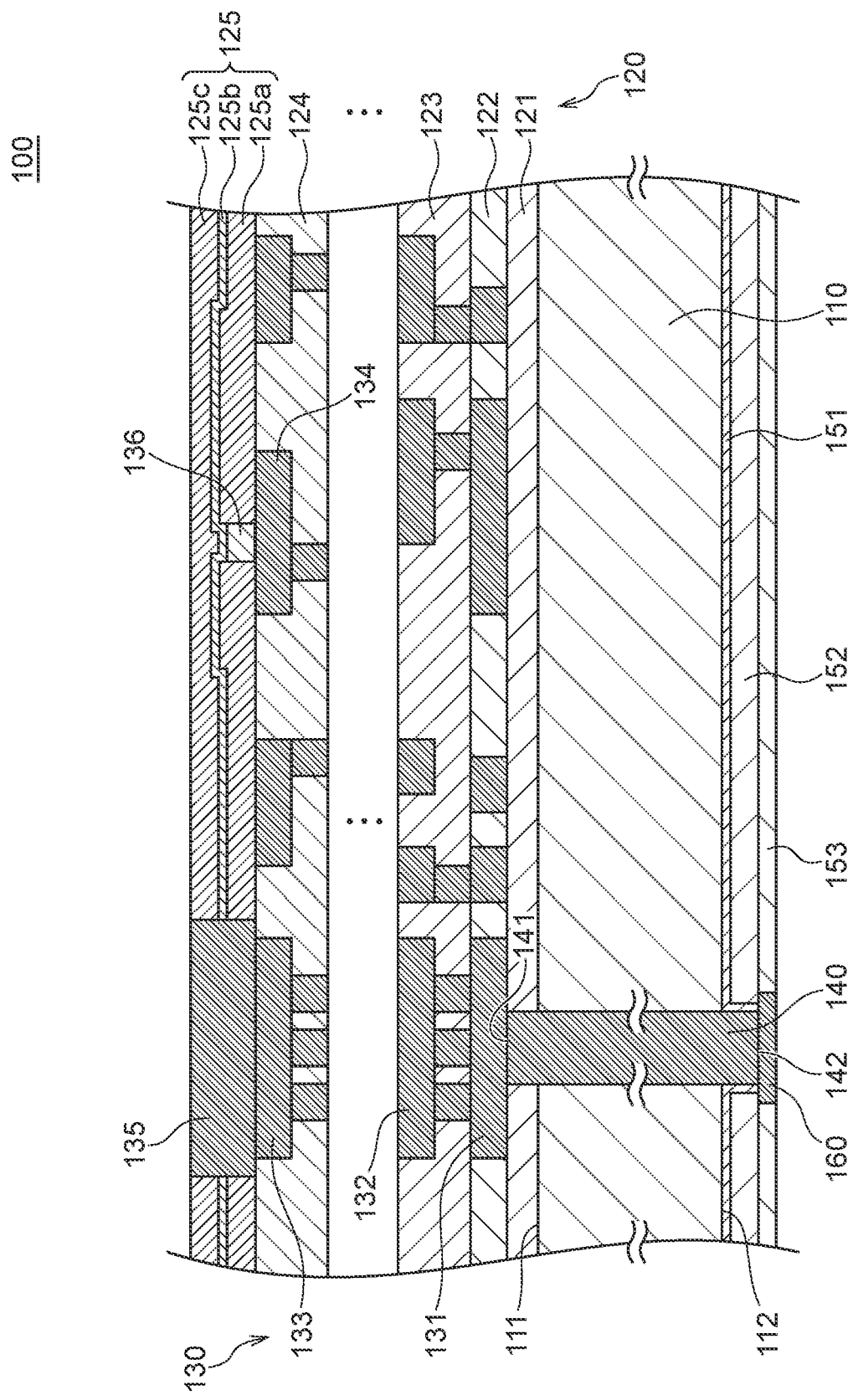
FIG. 1 is a schematic cross-section for explaining a structure of a semiconductor device according to a first embodiment.

Various embodiments of the present invention will be explained below in detail with reference to the accompanying drawings The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention, The various embodiments disclosed herein are not necessary mutually exclusive, as some disclosed embodiments can be combined with one or more other disclosed embodiments to form new embodiments.

As shown in FIG I, a semiconductor device 100 according to a first embodiment includes a silicon substrate 110, a plurality of interlayer insulating films 120 stacked on a main surface 111 of the silicon substrate 110, and a plurality of conductive patterns 130 embedded in the interlayer insulating films 120. The interlayer insulating films 120 include interlayer insulating films 121 to 125 stacked in this order. The number of interlayer insulating films is not specifically limited to any number. The interlayer insulating film 125 is an uppermost interlayer insulating film and configures one of outermost surfaces of the semiconductor device 100. The conductive patterns 130 include a conductive pattern 131 embedded in the interlayer insulating film 122, a conductive pattern 132 embedded in the interlayer insulating film 123, conductive patterns 133 and 134 embedded in the interlayer insulating film 124, and a pad electrode 135 and a tungsten plug 136 embedded in the interlayer insulating film 125. The conductive patterns 130 may be made of copper. The outermost interlayer insulating film 125 includes a silicon oxide film 125a, a silicon nitride film 125b, and a silicon oxide film 125c stacked in this order. The other interlayer insulating films 121 to 124 may mainly contain silicon oxide. The pad electrode 135 is provided to penetrate through the interlayer insulating film 125. Therefore, a surface of the pad electrode 135 is exposed from a surface of the interlayer insulating film 125. The surface of the pad electrode 135 and the surface of the interlayer insulating film 125 are substantially coplanar with each other. Meanwhile, the tungsten plug 136 is embedded not to be exposed from the surface of the interlayer insulating film 125. A lower surface of the tungsten plug 136 is entirely in contact with an upper surface of the conductive pattern 134, a side surface of the tungsten plug 136 is entirely covered with the silicon oxide film 125a, and an upper surface of the tungsten plug 136 is entirely covered with the silicon nitride film 125b. That is, the tungsten plug 136 is connected only to the conductive pattern 134, and is not electrically connected to other conductive patterns.

The conductive pattern 131 is connected to an upper end 141 of a TSV (through silicon via) 140 that penetrates through the silicon substrate 110. A lower end 142 of the TSV 140 is connected to a pad electrode 160. However, it is not essential to provide the TSV 140 in the silicon substrate 110 in the present embodiment, A rear surface 112 of the silicon substrate 110 is covered with insulating films 151 to 153. The insulating film 153 configures the other outermost surface of the semiconductor device 100. A surface of the pad electrode 160 and a surface of the insulating film 153 are substantially coplanar with each other.

Figure 2:
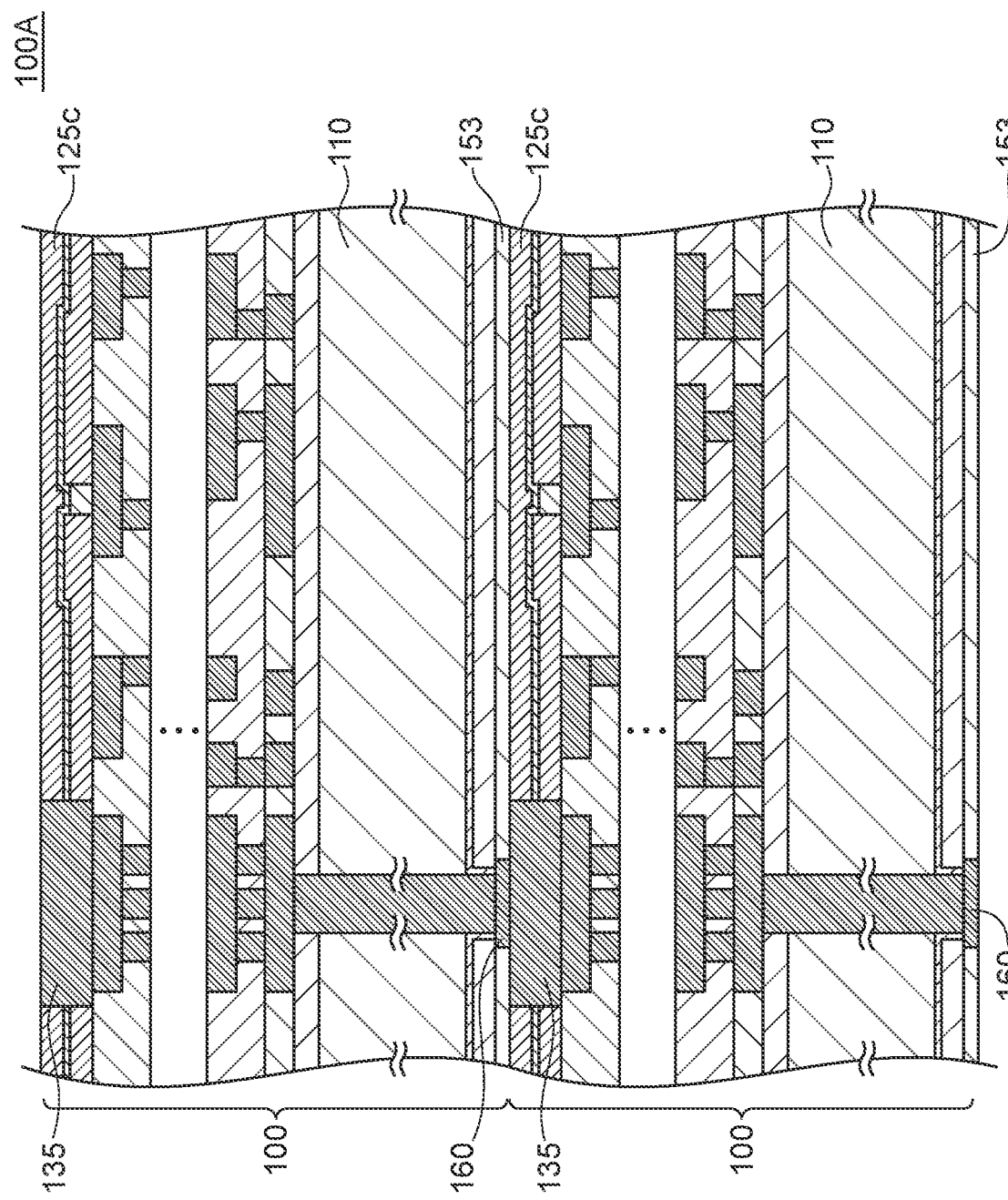
FIG. 2 is a schematic cross-section of a stacked semiconductor device in which semiconductor devices according to the first embodiment are stacked.

A stacked semiconductor device 100A can be formed by stacking a plurality of semiconductor devices 100 having this configuration as shown in FIG. 2, In a case of stacking the semiconductor devices 100, a lower semiconductor device 100 and an upper semiconductor device 100 are stacked in such a manner that the insulating film 125c that is the uppermost film of the lower semiconductor device 100 and the insulating film 153 that is the lowermost film of the upper semiconductor device 100 face each other, and hybrid bonding is performed. Accordingly, the pad electrode 135 of the lower semiconductor device 100 and the pad electrode 160 of the upper semiconductor device 100 are bonded to each other, and the insulating film 125c and the insulating film 153 are bonded to each other.

Next, a method of manufacturing the semiconductor device 100 is described.

Figure 5:
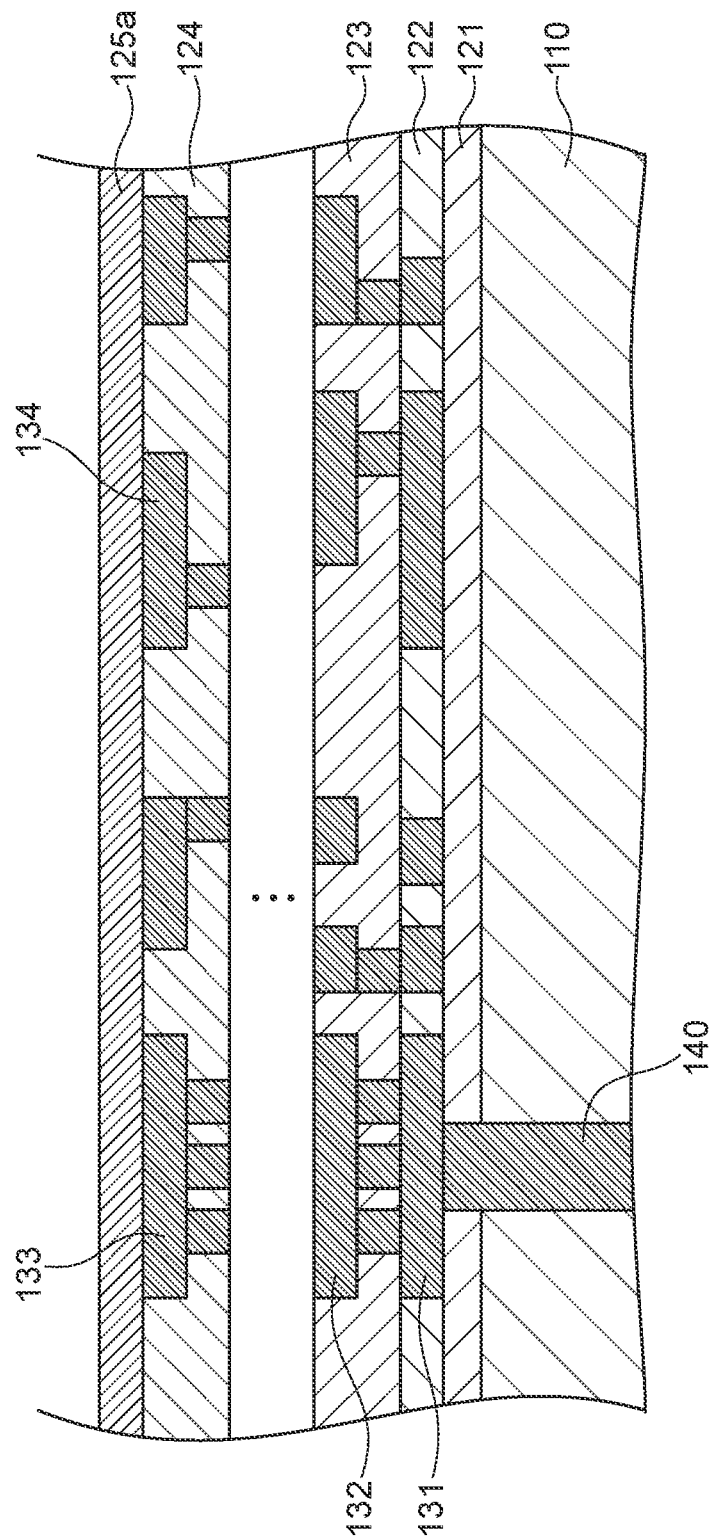

First, an element isolation region, a transistor, a capacitor, and the like (not shown) are formed on the main surface 111 of the silicon substrate 110, as shown in FIG. 3, thereafter local wires that connect elements to each other are formed, and the interlayer insulating film 121 covering them is formed by CVD. Further, the TSV 140 that reaches the inside of the silicon substrate 110 is formed by a via middle process. The TSV 140 is made of copper. A surface of the TSV 140 is covered with an insulating film (not shown) by which the TSV 140 is insulated from the silicon substrate 110. Next, as shown in FIG. 4, the interlayer insulating film 122 is formed, and thereafter a plurality of conductive patterns including the conductive pattern 131 are embedded in the interlayer insulating film 122 by the single damascene method. The conductive pattern 131 is provided at a position overlapping the TSV 140, and therefore the upper end 141 of the TSV 140 is in contact with the conductive pattern 131. Next, formation of an interlayer insulating film by CVD and formation of a conductive pattern by the dual damascene method are repeated, thereby forming the interlayer insulating films 122 to 125a and n conductive patterns, as shown in FIG. 5. The conductive patterns adjacent to each other in the vertical direction are connected to each other via a connection hole provided in the interlayer insulating film located between them.

Figure 6:
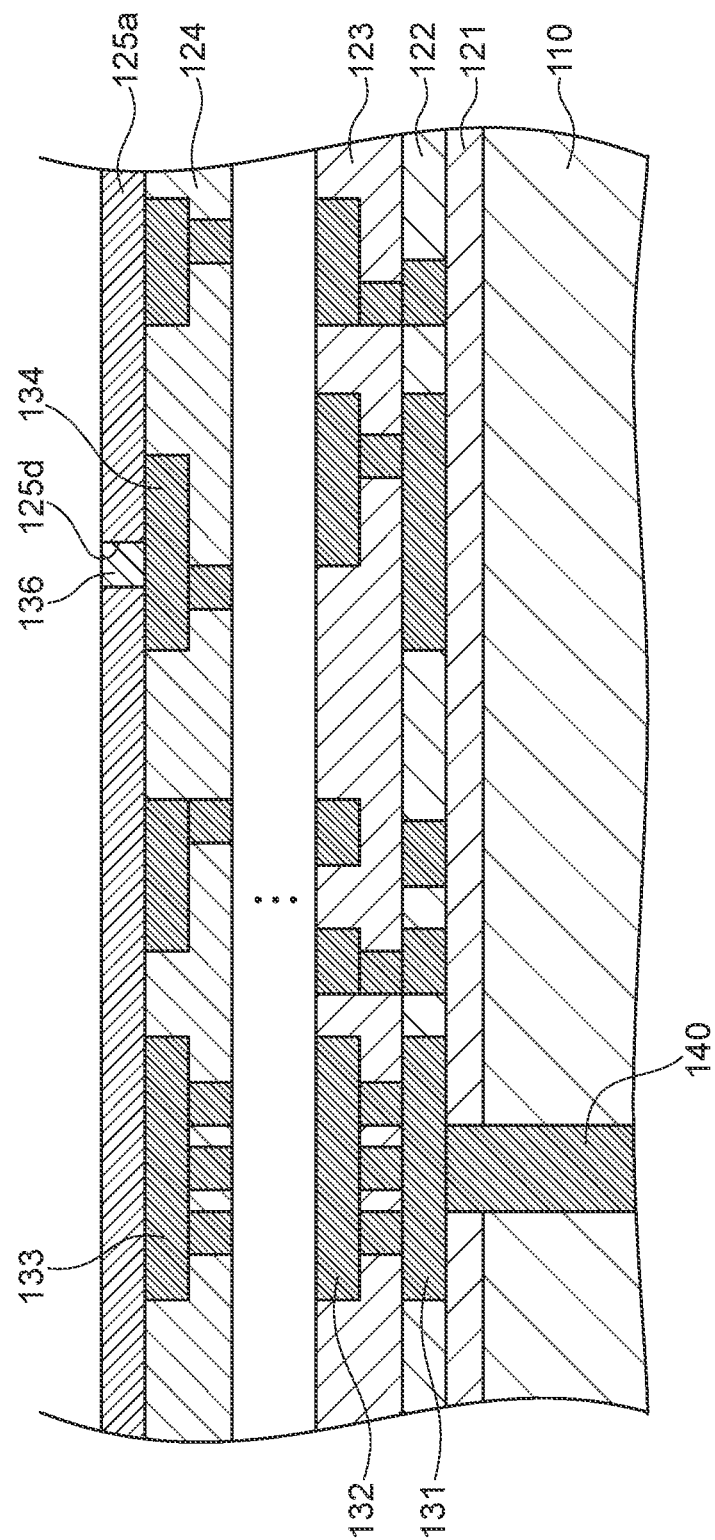

Next, thy etching is performed for the silicon oxide film 125a by using photoresist as a mask, thereby forming an opening 125d through which the conductive pattern 134 is exposed, in the silicon oxide film 125a, as shown in FIG. 6. After the photoresist is removed, a barrier layer made of, for example, titanium nitride is deposited by sputtering to cover the inside of the opening 125d and the surface of the silicon oxide film 125a, and tungsten is further deposited by CVD or PVD, so that the opening 125d is embedded. Subsequently, tungsten and the barrier layer formed on the surface of the silicon oxide film 125a are removed by CMP or dry etching, so that the tungsten plug 136 is formed, Although only one tungsten plug 136 is shown in FIG. 6, two or more tungsten plugs may be formed.

Figure 7:
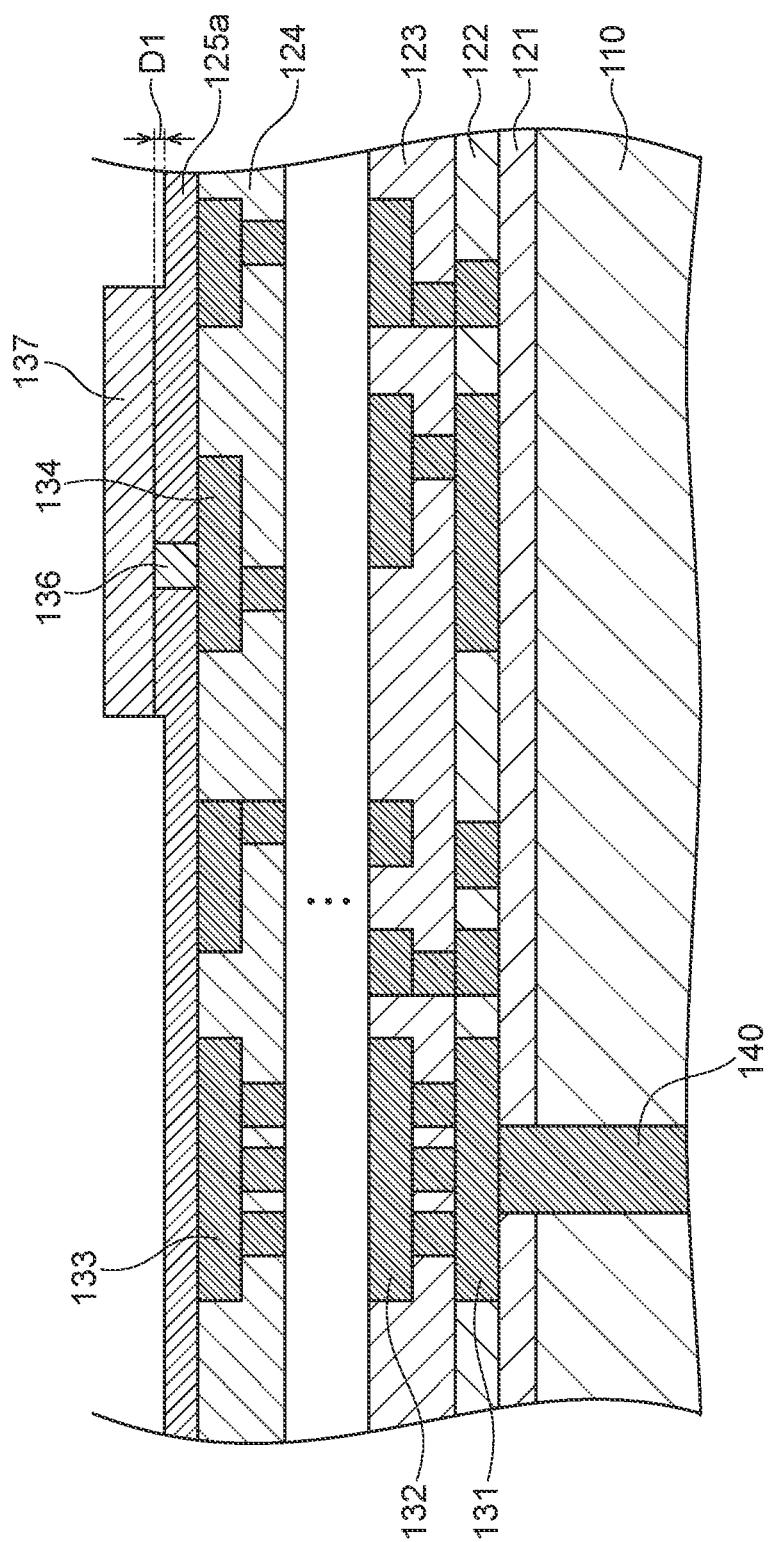

Next, as shown in FIG. 7, electrode materials are deposited on the surface of the silicon oxide film 125a by sputtering in the order of titanium, aluminum, and titanium nitride, for example, to be in contact with the tungsten plug 136, and thereafter dry etching is performed by using photoresist as a mask. Accordingly, a probe pad 137 is formed. Typically, the film thicknesses of titanium and titanium nitride are 5 to 30 nm and the film thickness of aluminum is 300 to 1500 nm. Chlorine gas such as $Cl_2$ or $BCl_3$, can be used in this dry etching. In this dry etching, overetching is performed in order to completely remove the electrode materials other than the probe pad 137. Therefore, a step D1 of several tens of nanometers is formed in the silicon oxide film 125a at a boundary between a portion overlapping the probe pad 137 and a portion not overlapping the probe pad 137. Next, a probe of a tester is brought into contact the probe pad 137, and the semiconductor device 100 is tested.

Figure 8:
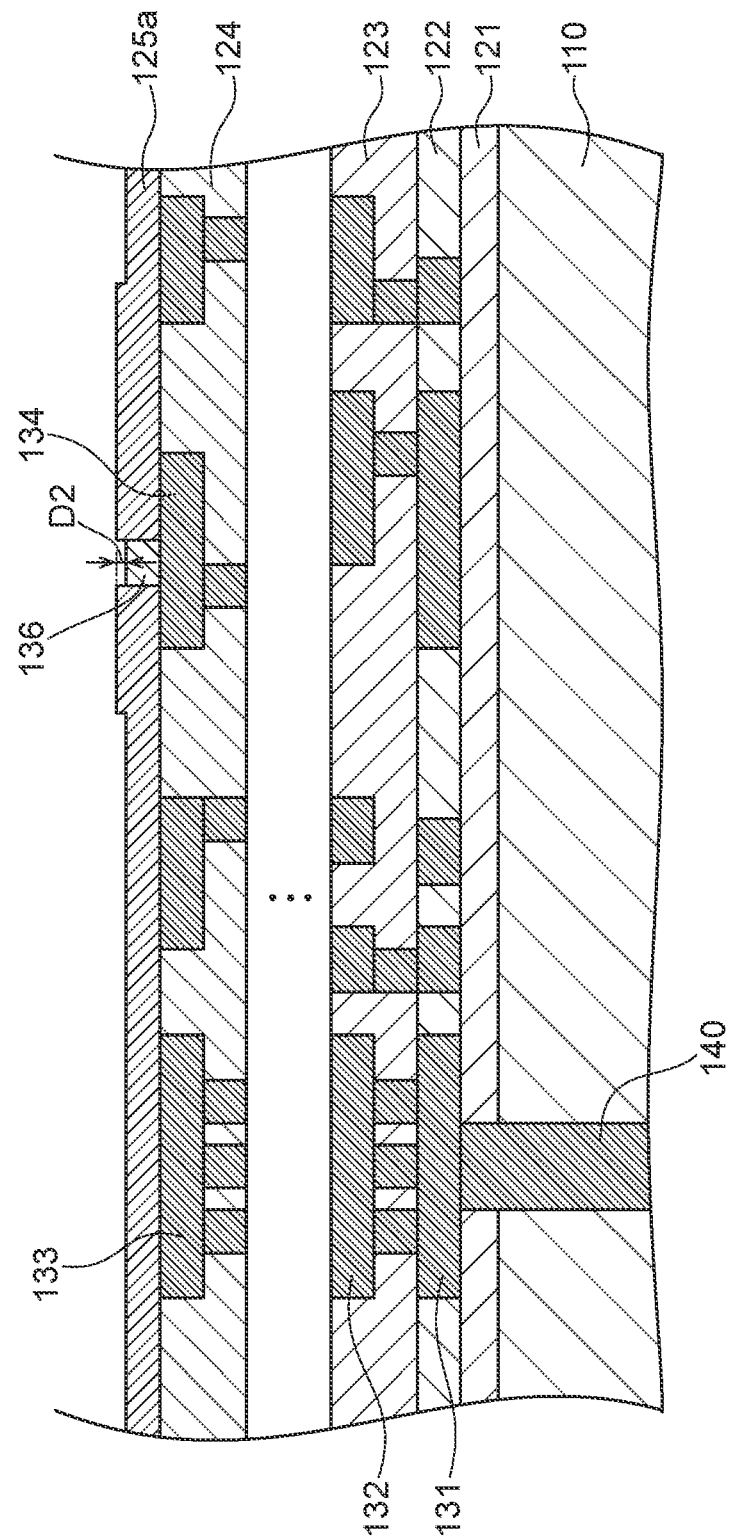
Figure 9:
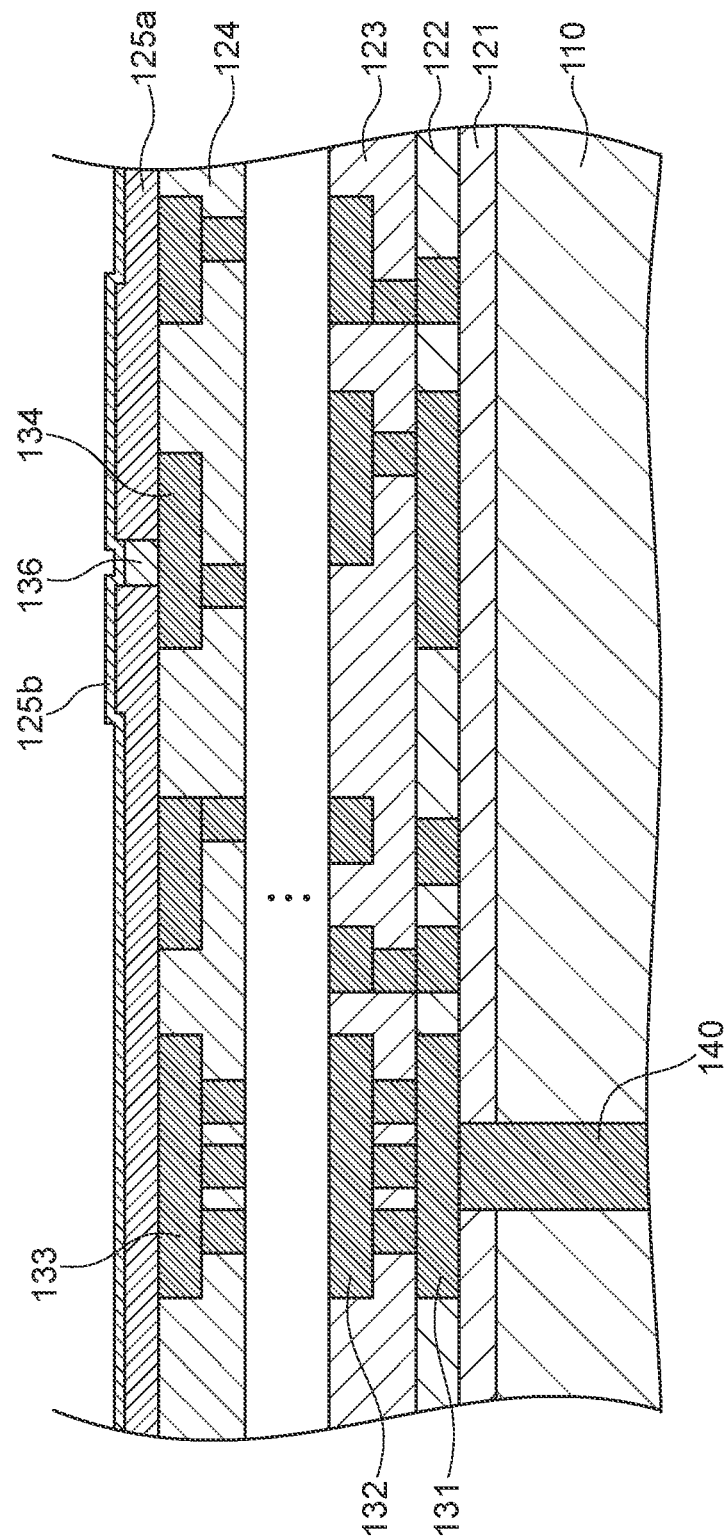

Next, as shown in FIG. 8, dry etching using chlorine gas such as $Cl_2$ or $BCl_3$, is performed for the entire surface of the silicon oxide film 125a without using a mask, so that the probe pad 137 is removed. Consequently, the tungsten plug 136 is exposed. In this etching, overetching is performed in order to completely remove the probe pad 137. Accordingly, a surface of the tungsten plug 136 is slightly etched by overetching for the probe pad 137 and the subsequent cleaning process, so that a step D2 of several tens of nanometers is formed. As a result, the silicon oxide film 125a includes an area surrounding the tungsten plug 136 and further includes another area surrounding the area surrounding the tungsten plug 136. The area surrounding the tungsten plug 136 has a thickness that is greater than the other area. Additionally, the thickness of the area of the silicon oxide film 125a surrounding the tungsten plug 136 is greater than a thickness of the tungsten plug 136. Next, as shown in FIG. 9, the silicon nitride film 125b is formed by CVD to cover the entire surface of the silicon oxide film 125a. The thickness of the silicon nitride film 125b is typically 5 to 50 nm.

Figure 10:
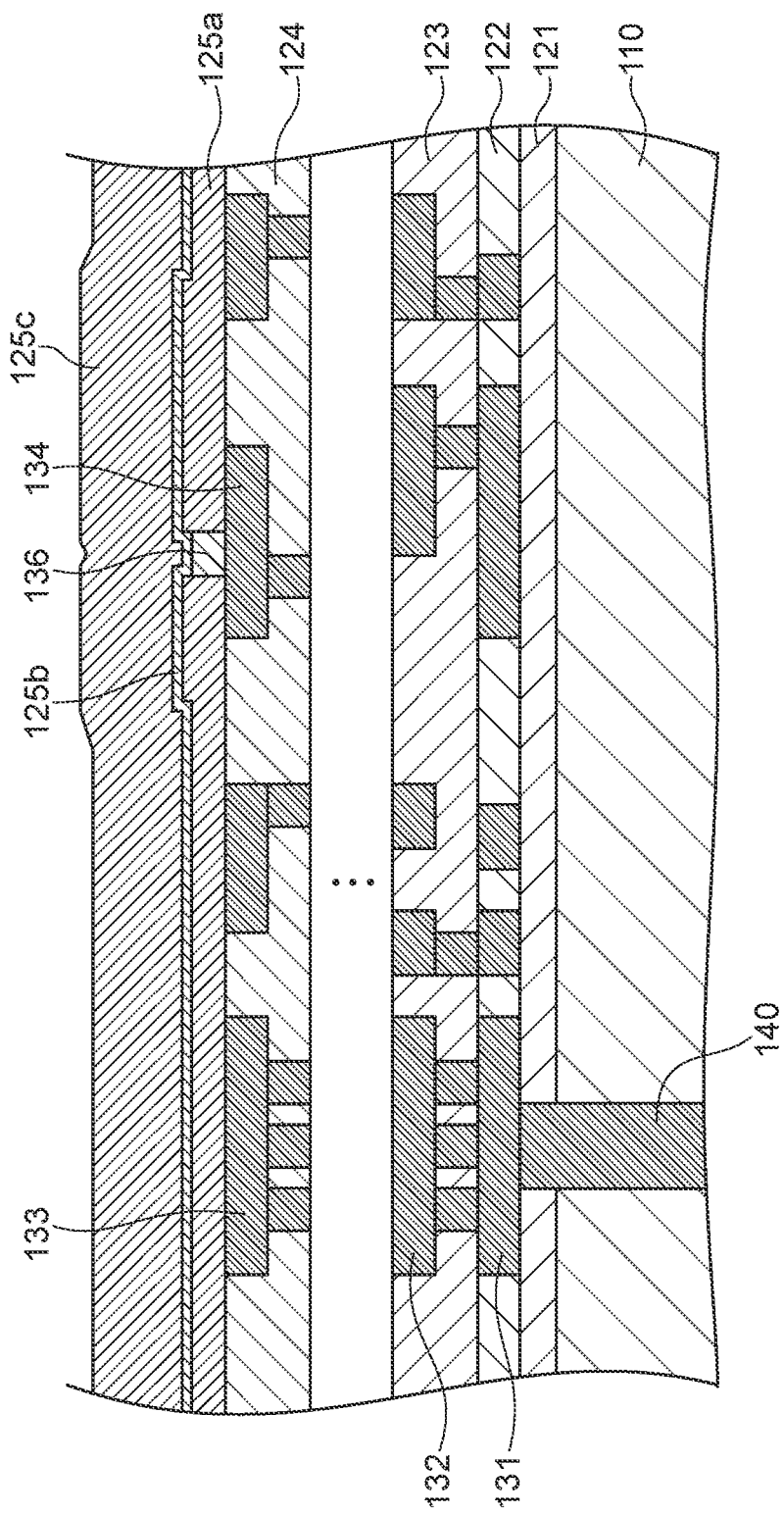
Figure 11:
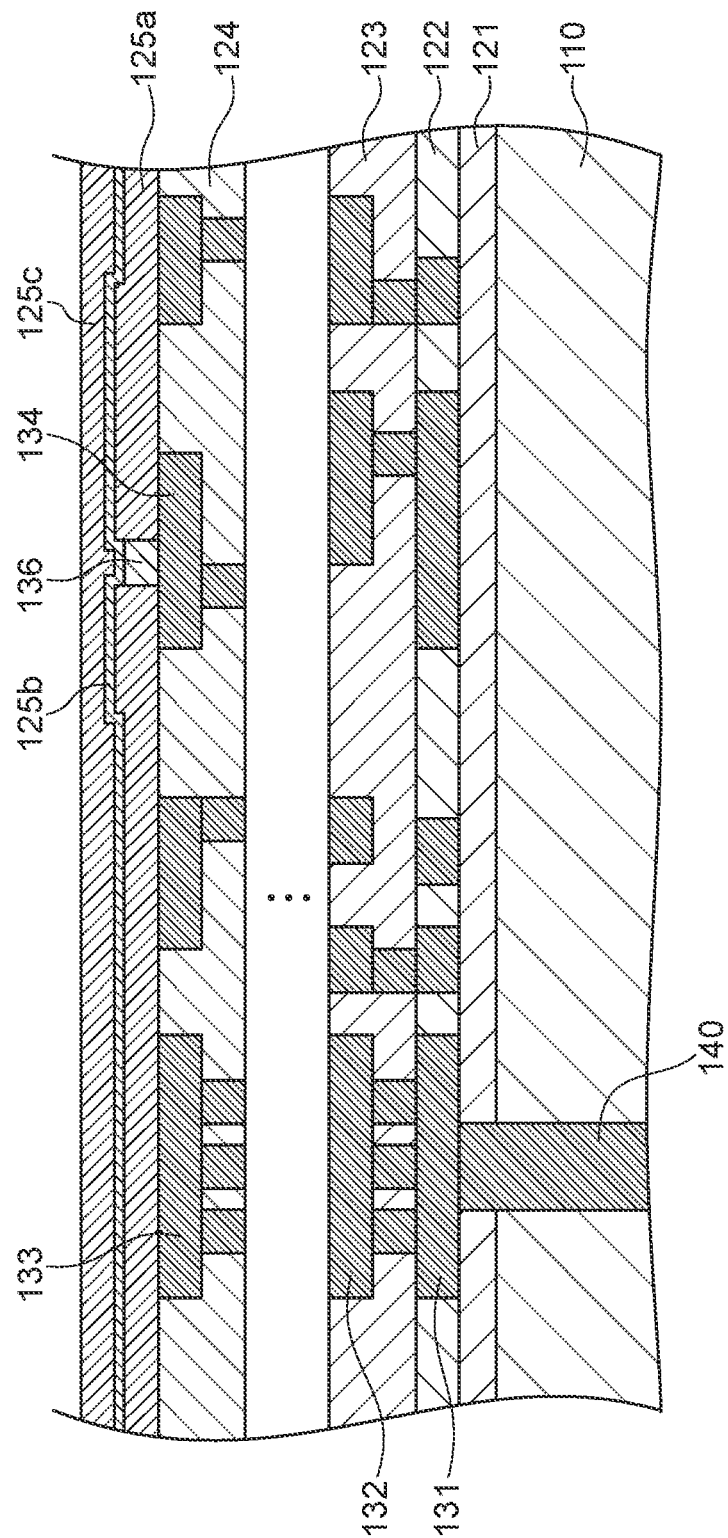
Figure 12:
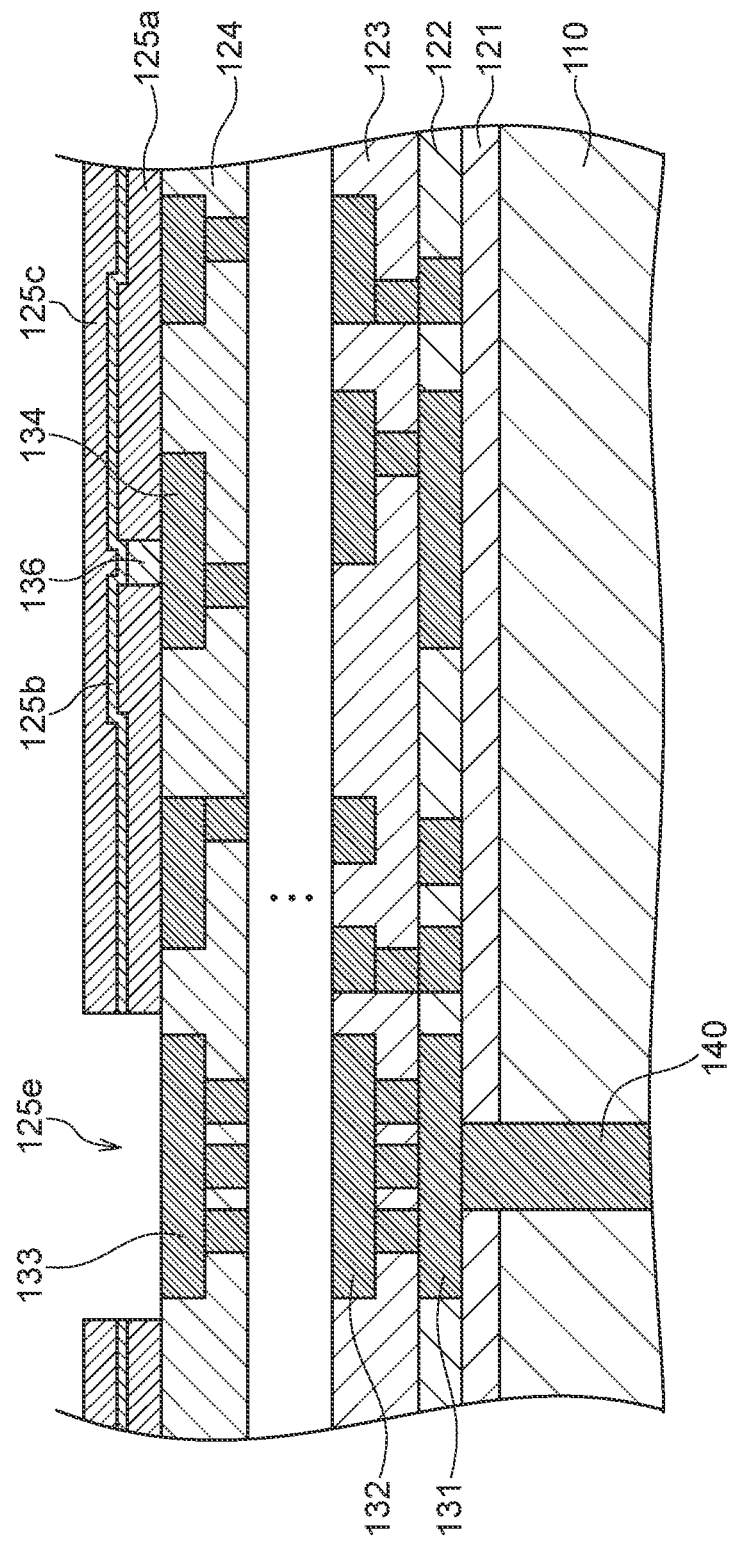
Figure 13:
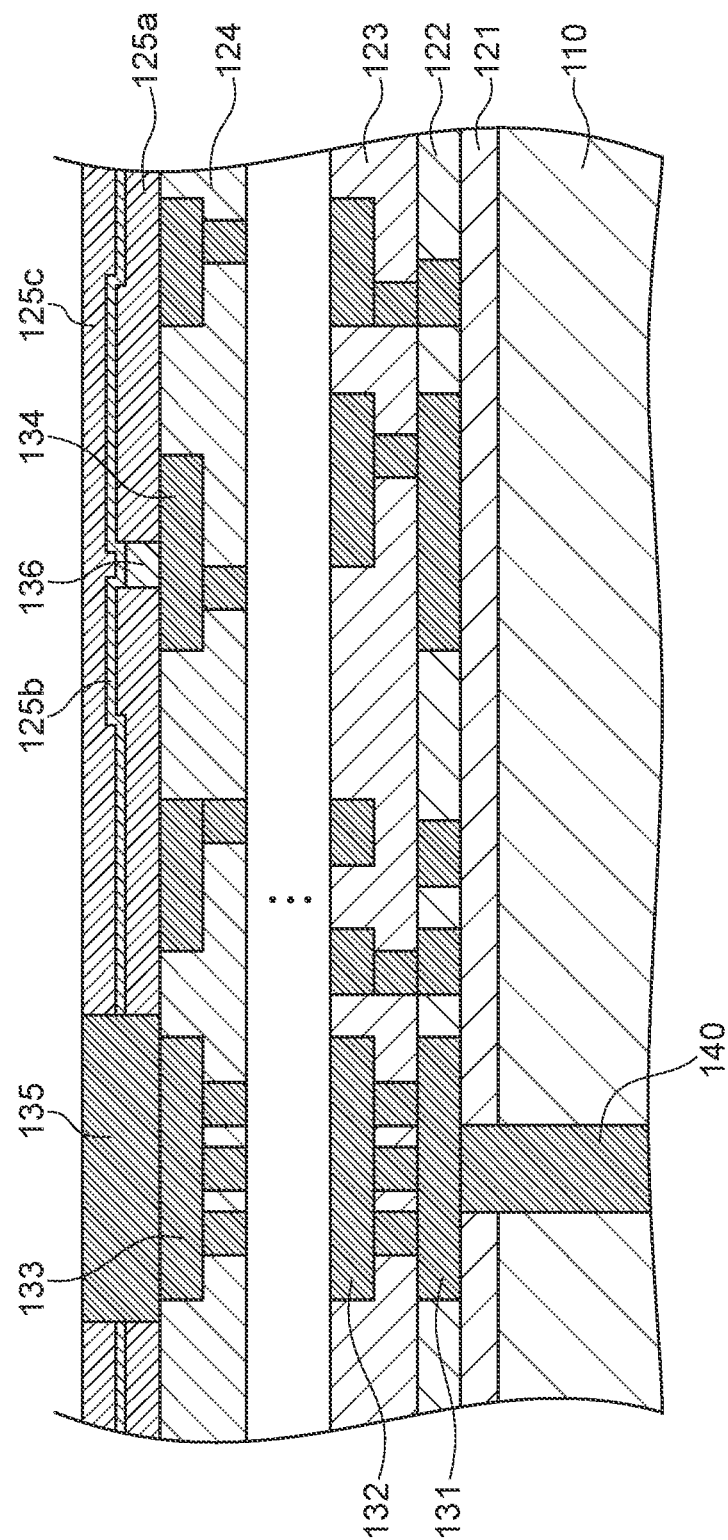

Next, as shown in FIG. 10, the insulating film 125c formed mainly by a silicon oxide film is deposited by CVD to cover the entire surface of the silicon nitride film 125b. The thickness of the insulating film 125c is typically 300 to 1000 nm, Since the insulating film 125c is deposited to follow the underlaying steps D1 and D2, a small step remains in its surface. Next, shown in FIG. 11, an upper portion of the insulating film 125c is removed by CMP, so that a flat surface is obtained. As a result, an upper surface of the insulating film 125c is substantially flat at a boundary between the area surrounding the tungsten plug 136 and the other area (that surrounds the area surrounding the tungsten plug 136) of the silicon oxide film 125a, The step D1 and/or step D2 are not reflected by the upper surface of the insulating film 125c. In a case where the steps D1 and D2 are sufficiently small, this CMP may be omitted. Next, as shown in FIG. 12, dry etching is performed for the interlayer insulating film 125 by using photoresist as a mask, thereby forming an opening 125e through which the conductive pattern 133 is exposed. Fluorine gas can be used in this dry etching. Next, as shown in FIG. 13, tantalum and copper are deposited in turn by sputtering to cover the surface of the interlayer insulating film 125 and the inside of the opening 125e. The film thicknesses of tantalum and copper are typically 5 to 10 nm and 30 to 100 nm, respectively. Further, copper is deposited by electroplating to completely fill the opening 125e. Subsequently, unnecessary copper on the surface of the interlayer insulating film 125 is removed by CMP. Consequently, the pad electrode 135 for connection is formed. Although the pad electrode 135 is formed by the single damascene method in the processes shown in FIGS. 12 and 13, a main body portion of the pad electrode 135 and a via conductor portion that connects the main body portion of the pad electrode 135 and the conductive pattern 133 to each other may be formed simultaneously by the dual damascene method. In a case of using the dual damascene method, it is possible to additionally form a wiring layer for signal transmission or power supply at the same time: as formation of the pad electrode 135.

In a case where the TSV 140 is not formed, production of the semiconductor device 100 is completed by the above processes. In a case where the TSV 140 is formed, the following processes are performed subsequently.

Figure 14:
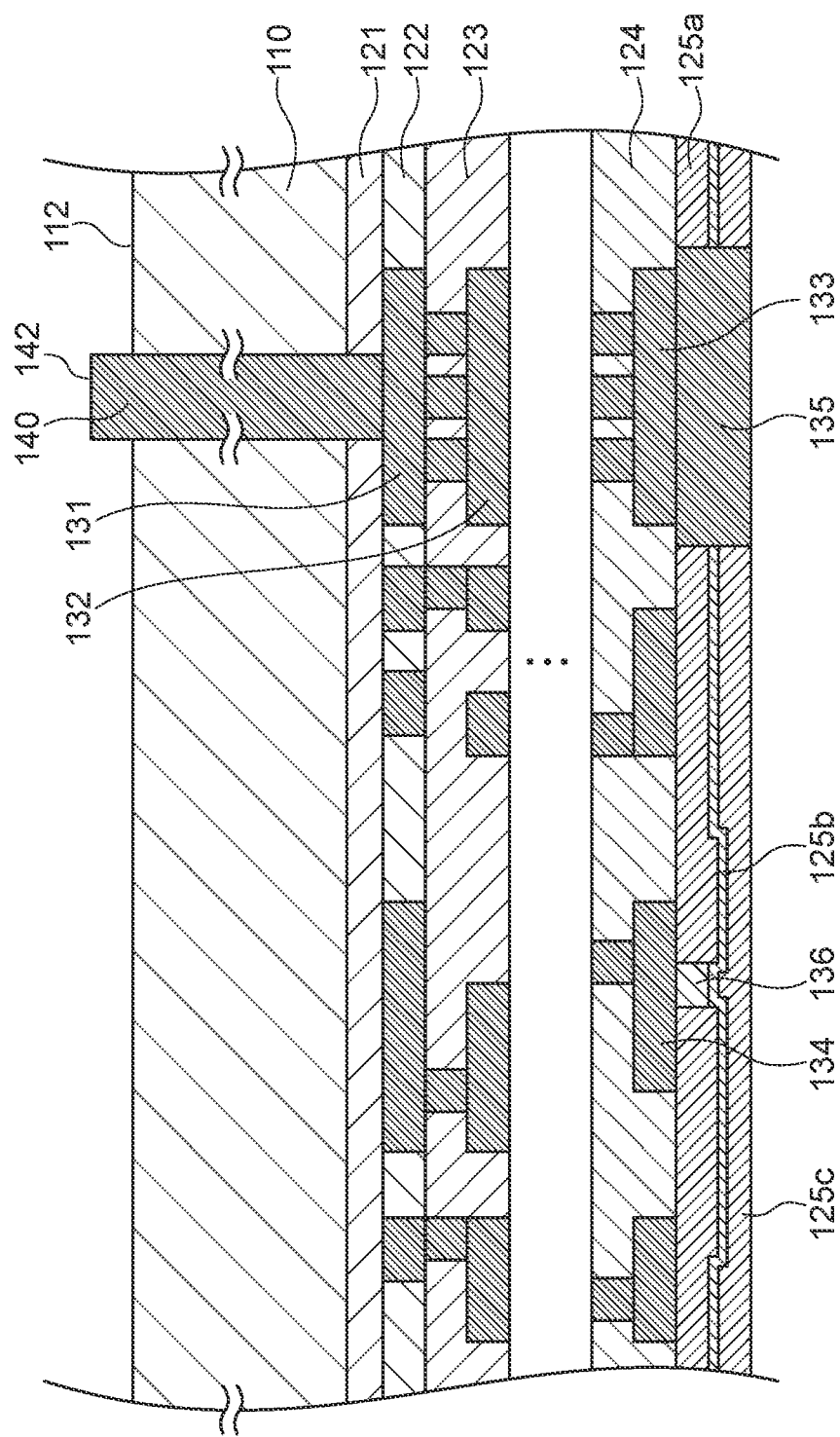
Figure 15:
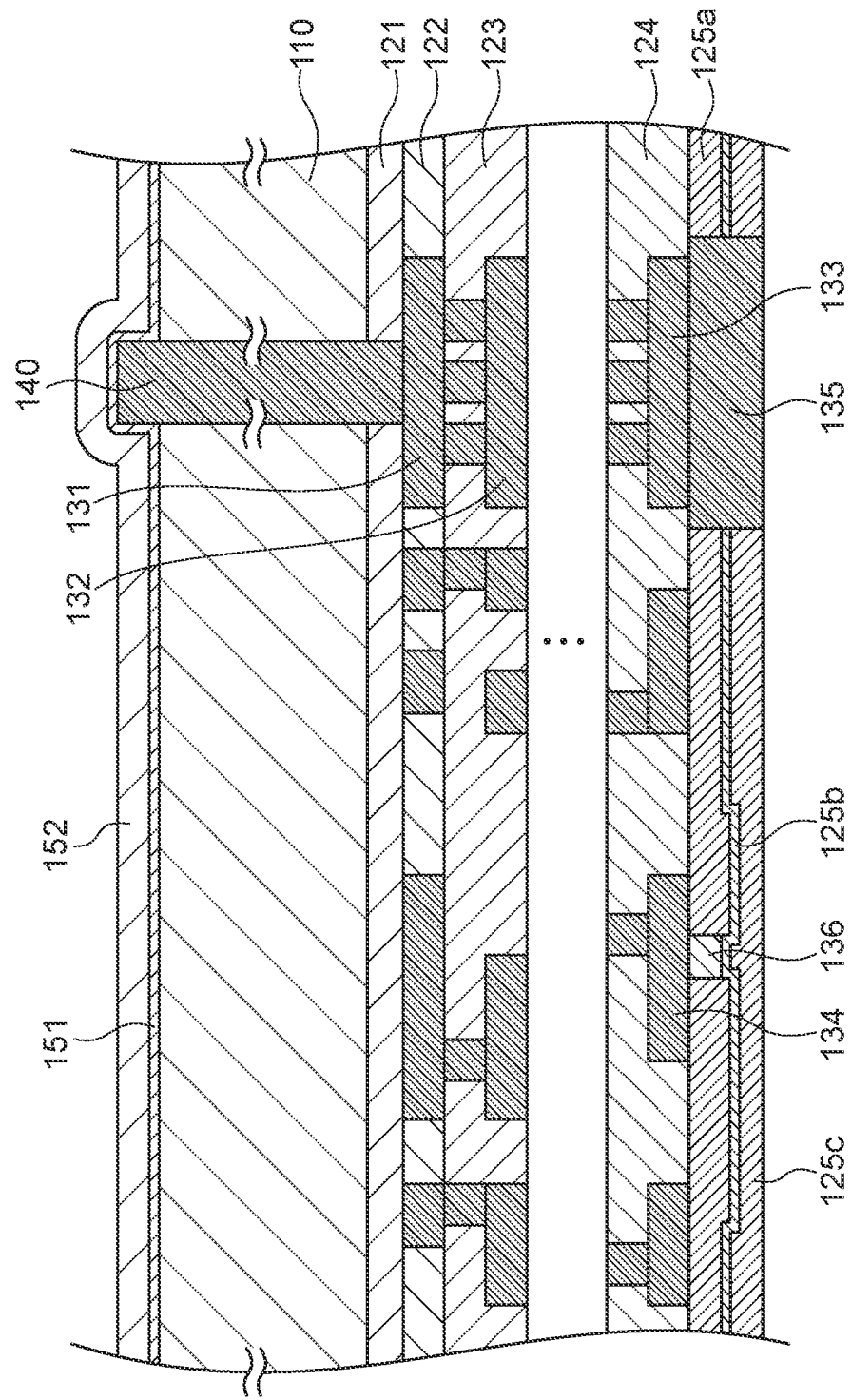

First, as shown in FIG. 14, the silicon substrate 110 is turned upside down, and is bonded to a support substrate (not shown) made of silicon or glass with adhesive on the main surface 111 side. In this state, the silicon substrate 110 is polished from the rear surface 112 side immediately before the lower end 142 of the TSV 140 is exposed. The distance from the rear surface 112 to the lower end 142 of the TSV 140 at end of polishing is about 2 to 10 µm, for example, Further, dry etching using $SF_6$ gas, for example, is performed for the rear surface 112 of the silicon substrate 110, so that the lower end 142 of the TSV 140 is exposed. The protruding length of the TSV 140 from the rear surface 112 of the silicon substrate 110 is about 2 to 10 µm, for example. The lower end 142 of the TSV 140 is covered with a thin insulating film (not shown) in order to prevent contact between copper forming the TSV 140 and the silicon substrate 110. Next, as shown is FIG. 15, the silicon nitride film 151 is deposited by CVD to cover the entire rear surface 112 of the silicon substrate 110 including the lower end 142 of the TSV 140, and the silicon oxide film 152 is further deposited by CVD. The thicknesses of the silicon nitride film 151 and the silicon oxide film 152 are, for example, 20 to 200 nm and 2 to 10 µm, respectively. That is, the film thickness of the silicon oxide film 152 is approximately the same as the protruding length of the TSV 140.

Figure 16:
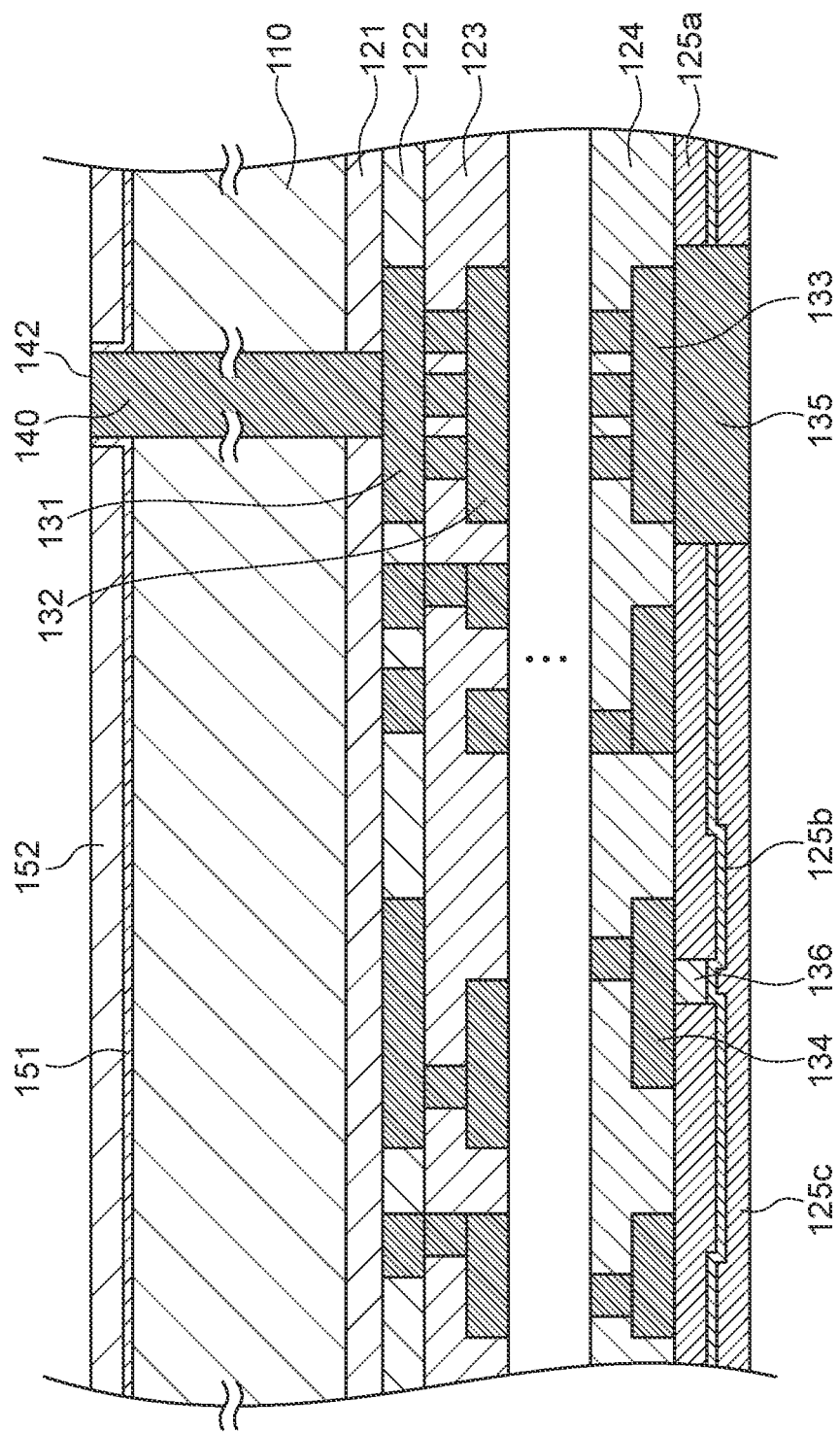
Figure 17:
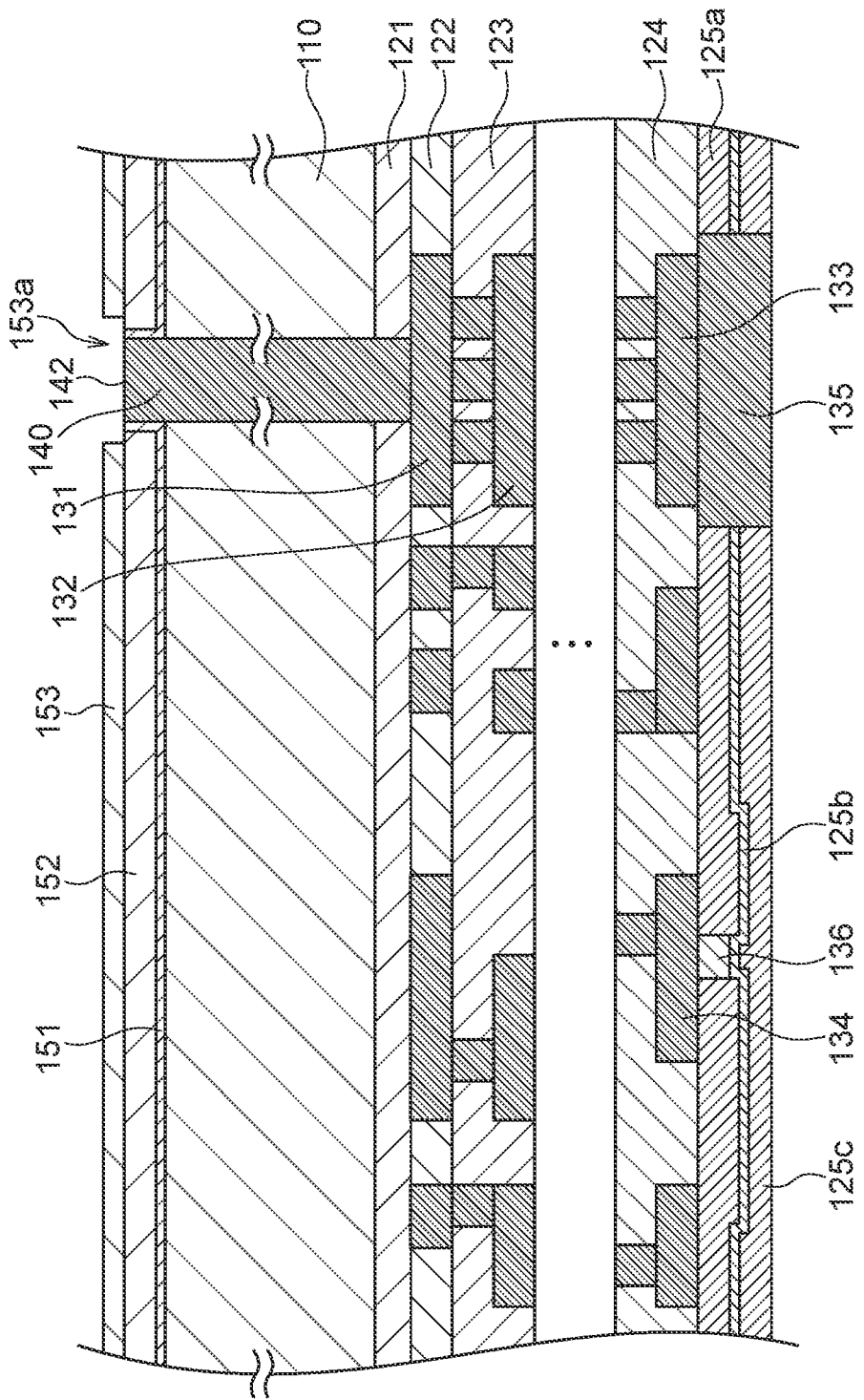

Next, as shown in FIG. 16, the silicon oxide film 152 is flattened by CMP. In this process, the lower end 142 of the TSV 140 is also polished, so that copper forming the TSV 140 is exposed. Next, as shown in FIG. 17, the insulating film 153 mainly formed by a silicon oxide film is deposited to cover the entire silicon oxide film 152 including the lower end 142 of the TSV 140. Further, tar etching is performed for the insulating film 153 by using photoresist as a mask, thereby forming an opening 153a through which the lower end 142 of the TSV 140 is exposed, in the insulating film 153. Next, tantalum and copper are deposited by sputtering in turn to cover the surface of the insulating film 153 and the inside of the opening 153a. The film thicknesses of tantalum and copper are typically 5 to 10 nm and 30 to 100 nm, respectively. Further, copper deposited by electroplating to completely fill the opening 153a. Subsequently, unnecessary copper on the surface of the insulating film 153 is removed by CMP. Consequently, the pad electrode 160 for connection shown in FIG. 1 is formed, and the semiconductor device 100 according to the present embodiment is completed. In the process of forming the pad electrode 160 by a damascene process, a RDL (a rewiring layer) may he simultaneously formed on the rear surface 112 of the silicon substrate 110, as necessary.

The stacked semiconductor device 100A can be configured by stacking a plurality of semiconductor devices 100 produced in the above-described manner by hybrid bonding as shown in FIG. 2. In a case where the stacked semiconductor device 100A shown in FIG. 2 is implemented while being turned upside down, it is unnecessary to provide the TSV 140 in the uppermost semiconductor device 100.

As described above, the semiconductor device 100 according to the present embodiment can have high flatness required for hybrid bonding, because the probe pad 137 is removed after an operation test using the probe pad 137, and thereafter the pad electrode 135 and the interlayer insulating film 125 that are substantially coplanar with each other are formed. Further, after the pad electrode 135 is formed, it is possible to proceed to a process of hybrid bonding without a test process. Therefore, a time for which the pad electrode 135 for connection is exposed to the atmosphere is reduced. Accordingly, it is possible to minimize corrosion of copper forming the pad electrode 135.

Next, a second embodiment is described.

Figure 18:
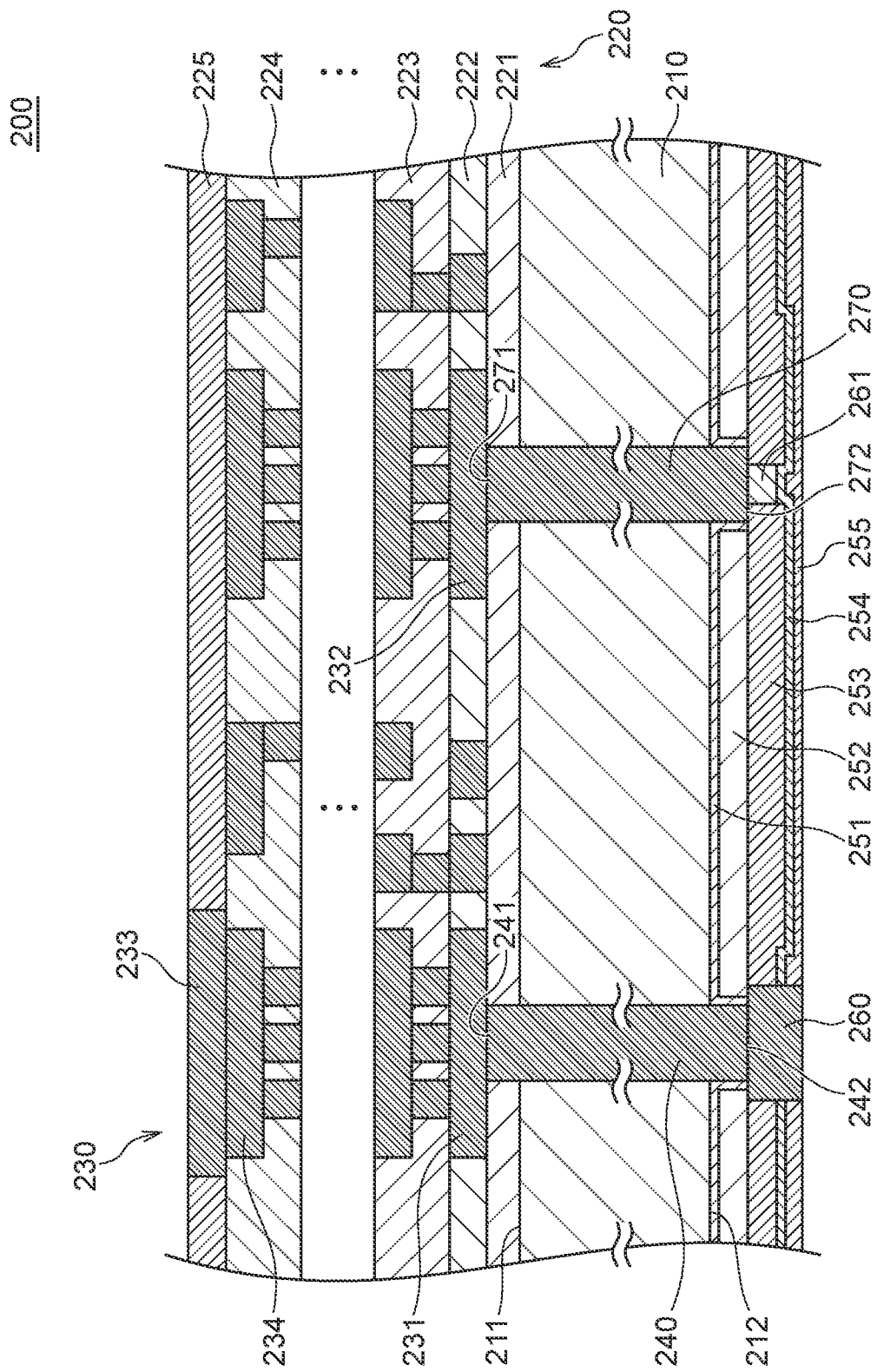
FIG. 18 is a schematic cross-section for explaining a structure of a semiconductor device according to a second embodiment.

As shown in FIG. 18, a semiconductor device 200 according to the second embodiment includes a silicon substrate 210, a plurality of interlayer insulating films 220 stacked on a main surface 211 of the silicon substrate 210, and a plurality of conductive patterns 230 embedded in the interlayer insulating films 220. The interlayer insulating films 220 include interlayer insulating films 221 to 225 stacked in this order. The number of interlayer insulating films is not specifically limited to any number. The interlayer insulating film 225 is an uppermost interlayer insulating film and configures one of outermost surfaces of the semiconductor device 200. The conductive patterns 230 include conductive patterns 231 and 232 embedded in the interlayer insulating film 222, a conductive pattern 234 embedded in the interlayer insulating film 224, and a pad electrode 233 embedded in the interlayer insulating film 225. The conductive patterns 230 may be made of copper. The interlayer insulating films 220 may mainly contain silicon oxide. A surface of the pad electrode 233 is exposed from a surface of the interlayer insulating film 225. The surface of the pad electrode 233 and the surface of the interlayer insulating film 225 are substantially coplanar with each other.

The conductive pattern 231 is connected to an upper end 241 of a TSV 240 that penetrates through the silicon substrate 210. A lower end 242 of the TSV 240 is connected to a pad electrode 260. The conductive pattern 232 is connected to an upper end 271 of a TSV 270 that penetrates through the silicon substrate 210. A lower end 272 of the TSV 270 is connected to a tungsten plug 261. A rear surface 212 of the silicon substrate 210 is covered with insulating films 251 to 255. The insulating films 251 and 254 may be made of silicon nitride, and the insulating films 252, 253, and 255 may mainly contain silicon oxide. The insulating film 255 configures the other outermost surface of the semiconductor device 200. A surface of the pad electrode 260 and a surface of the insulating film 255 are substantially coplanar with each other. Meanwhile, the tungsten plug 261 is embedded without being exposed from the other outermost surface of the semiconductor device 200. An upper surface of the tungsten plug 261 is entirely in contact with the lower end 272 of the TSV 270, a side surface of the tungsten plug 261 is entirely covered with the insulating film 253, and a lower surface of the tungsten plug 261 is entirely covered with the insulating film 254.

A stacked semiconductor device 200A can be configured by stacking a plurality of semiconductor devices 200 having the configuration described above as shown in FIG. 19. In a case of stacking the semiconductor devices 200, a lower semiconductor device 200 and an upper semiconductor device 200 are stacked in such a manner that the insulating film 225 that is an uppermost film of the lower semiconductor device 200 and the insulating film 255 that is a lowermost film of the upper semiconductor device 200 face each other, and hybrid bonding is performed. By this bonding, the pad electrode 233 of the lower semiconductor device 200 and the pad electrode 260 of the upper semiconductor device 200 are bonded to each other, and the insulating film 225 and the insulating film 255 are bonded to each other.

Next, a method of manufacturing the semiconductor device 200 is described.

Figure 20:
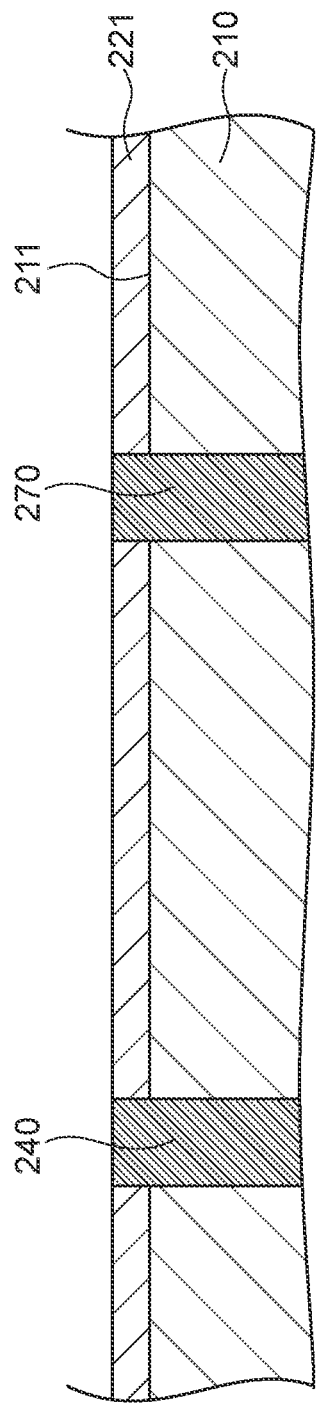
FIGS. 20 to 32 are process diagrams for explaining a method of manufacturing the semiconductor device according to the second embodiment.
Figure 21:
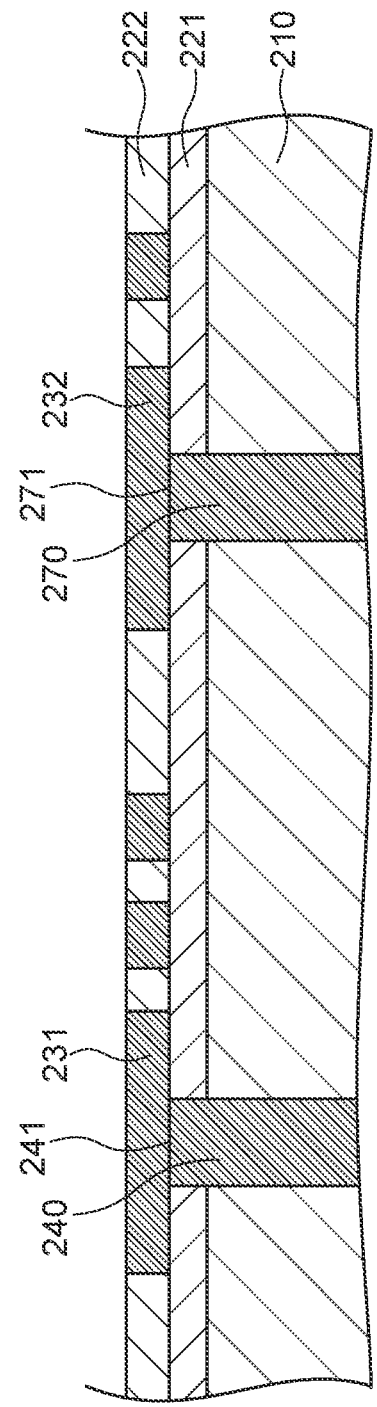
Figure 22:
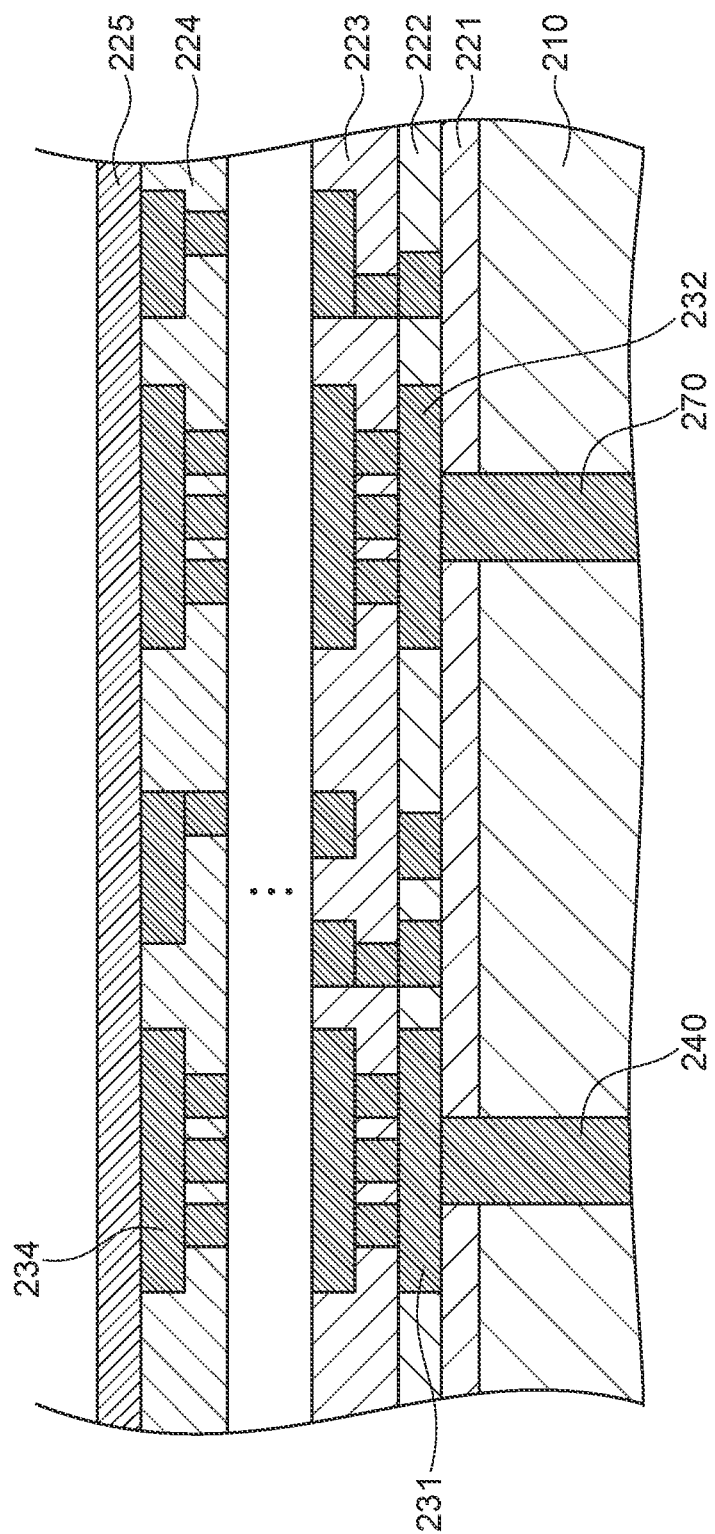

First, as shown in FIG. 20, an element isolation region, a transistor, a capacitor, and the like (not shown) are formed on the main surface 211 of the silicon substrate 210, thereafter local wires that connect elements to each other are formed, and the interlayer insulating film 221 covering them is formed by CVD. Further, the TSVs 240 and 270 that reach to the inside of the silicon substrate 210 are formed. The TSVs 240 and 270 are made of copper. Surfaces of the TSVs 240 and 270 are respectively covered with insulating films (not shown) by which the TSVs 240 and 270 are insulated from the silicon substrate 210. Next, as shown in FIG. 21, the interlayer insulating film 222 is formed, and thereafter a plurality of conductive patterns including the conductive patterns 231 and 232 are embedded into the interlayer insulating film 222 by the single damascene method. The conductive pattern 231 is provided at a position overlapping the TSV 240, so that the upper end 241 of the TSV 240 is in contact with the conductive pattern 231. The conductive pattern 232 is provided at a position overlapping the TSV 270, so that the upper end 271 of the TSV 270 is in contact with the conductive pattern 232. Next, formation of an interlayer insulating film by CVD and formation. of a conductive pattern by the dual damascene method are repeated, thereby forming the interlayer insulating films 222 to 225 and n conductive patterns, as shown in FIG. 22. The conductive patterns adjacent in the vertical direction are connected to each other through a connection hole provided in the interlayer insulating film located between them.

Figure 23:
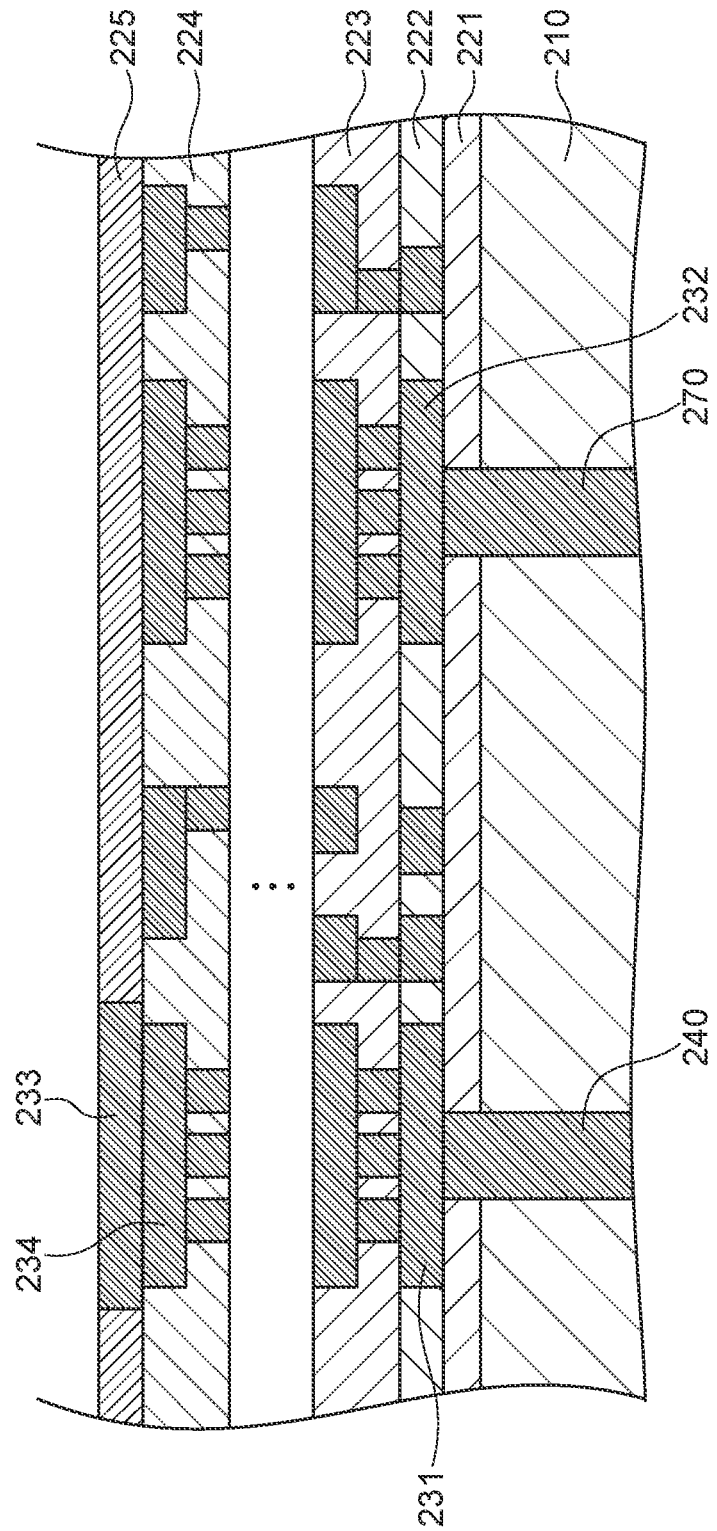

Next, as shown in FIG. 23, dry etching is performed for the interlayer insulating film 225 by using photoresist as a mask to form an opening through which the conductive pattern 234 is exposed, and thereafter the pad electrode 233 for connection is formed by the single damascene method. By using the dual damascene method in place of the single damascene method, a main body portion of the pad electrode 233 and a via conductor portion that connects the main body portion of the pad electrode 233 and the conductive pattern 234 to each other may be simultaneously formed.

Figure 24:
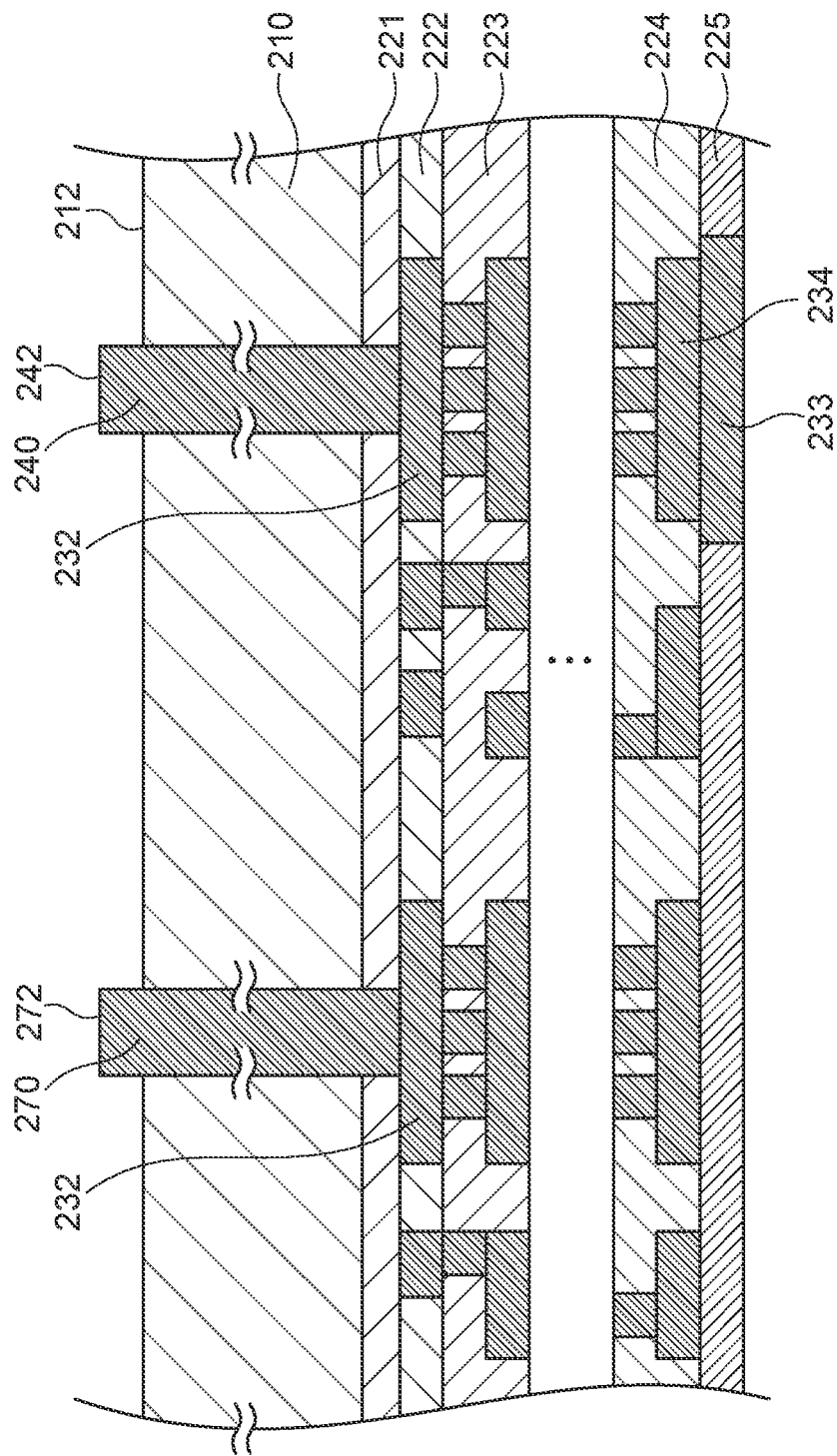
Figure 25:
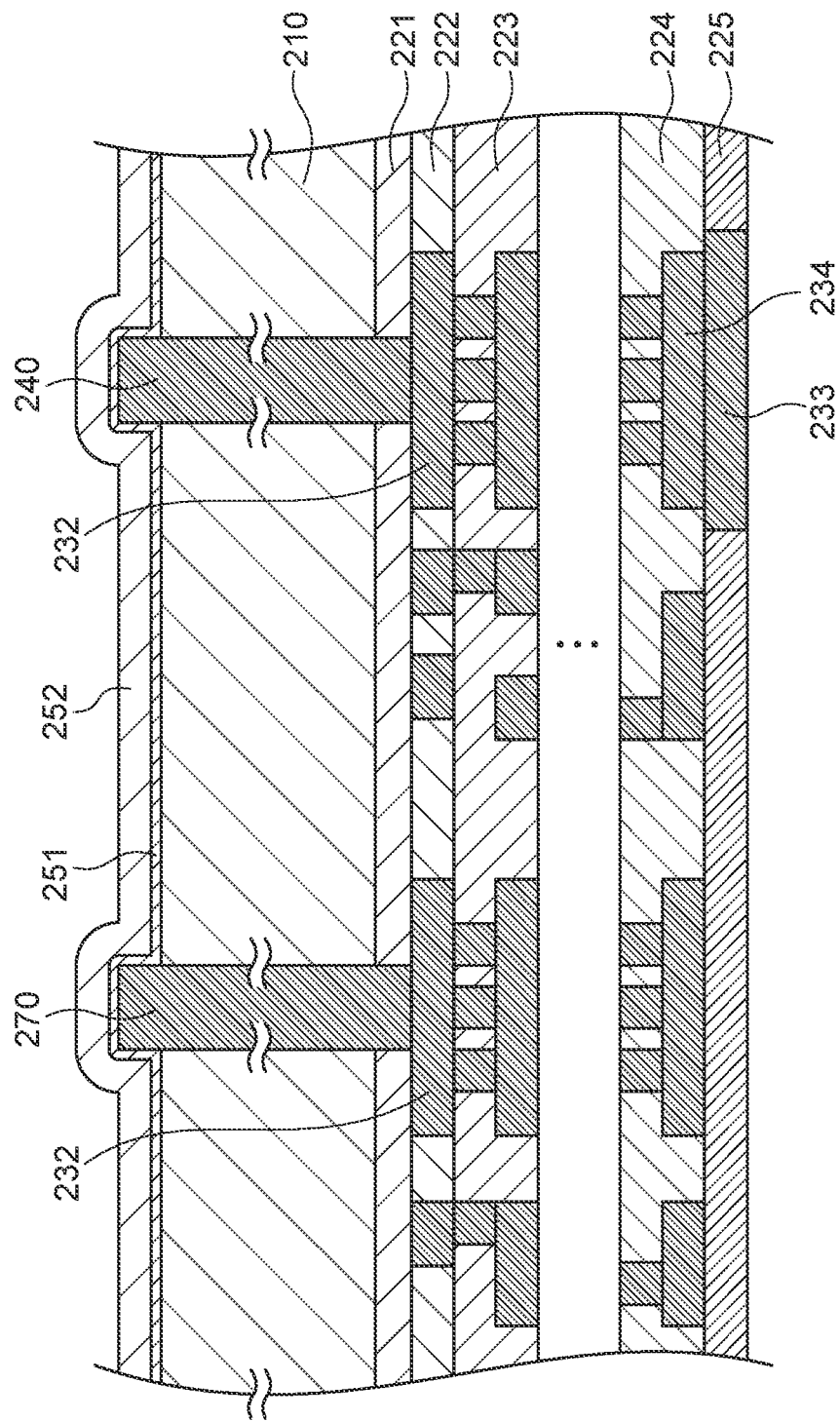

Next, as shown in FIG. 24, the silicon substrate 210 is turned upside down, and the silicon substrate 210 is bonded to a support substrate (not shown) made of silicon or glass with adhesive on the main surface 211 side. In this state, the silicon substrate 210 is polished from the rear surface 212 side immediately before the lower ends 242 and 272 of the TSVs 240 and 270 are exposed. A distance from the rear surface 212 of the silicon substrate 210 to each of the lower ends 242 and 272 of the TSVs 240 and 270 at end of polishing is about 2 to 10 µm, for example Further, dry etching is performed for the rear surface 212 of the silicon substrate 210 by using $SF_6$ gas, for example, thereby causing the lower ends 242 and 272 of the TSVs 240 and 270 to be exposed. The protruding length of each of the TSVs 240 and 270 from the rear surface 212 of the silicon substrate 210 is about 2 to 10 µm, for example. The lower ends 242 and 272 of the TSVs 240 and 270 are respectively covered with thin insulating films (not shown) in order to prevent contact between copper forming the TSVs 240 and 270 and the silicon substrate 210. Next, as shown in FIG. 25, the silicon nitride film 251 is deposited by CVD to cover the entire rear surface 212 of the silicon substrate 210 including the lower ends 242 and 272 of the TSVs 240 and 270, and the silicon oxide film 252 is further deposited by CVD. The thicknesses of the silicon nitride film 251 and the silicon oxide film 252 are, for example, 20 to 200 nm and 2 to 10 µm, respectively. That is, the thickness of the silicon oxide film 252 is approximately the same as the protruding length of the TSVs 240 and 270.

Figure 26:
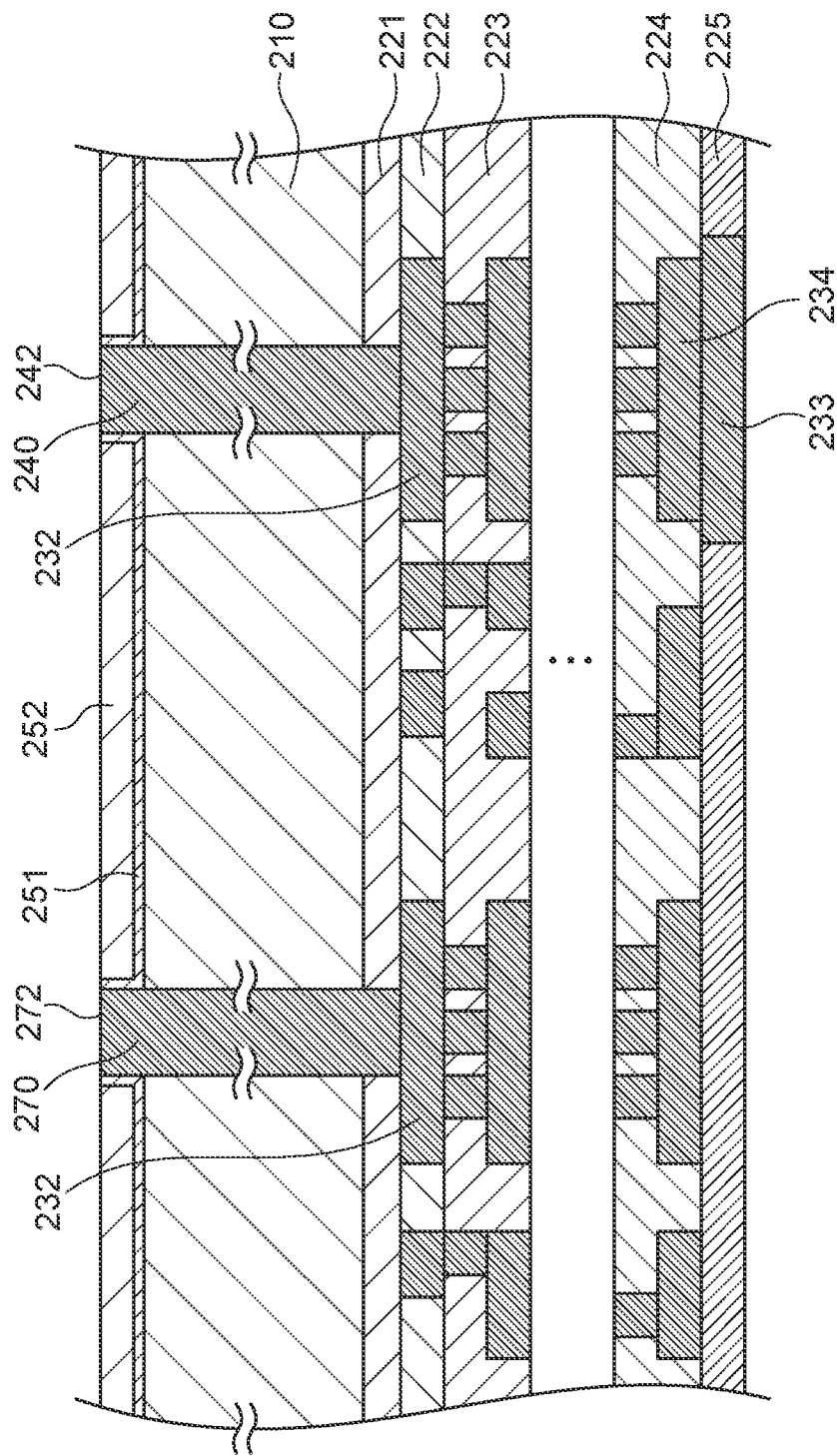
Figure 27:
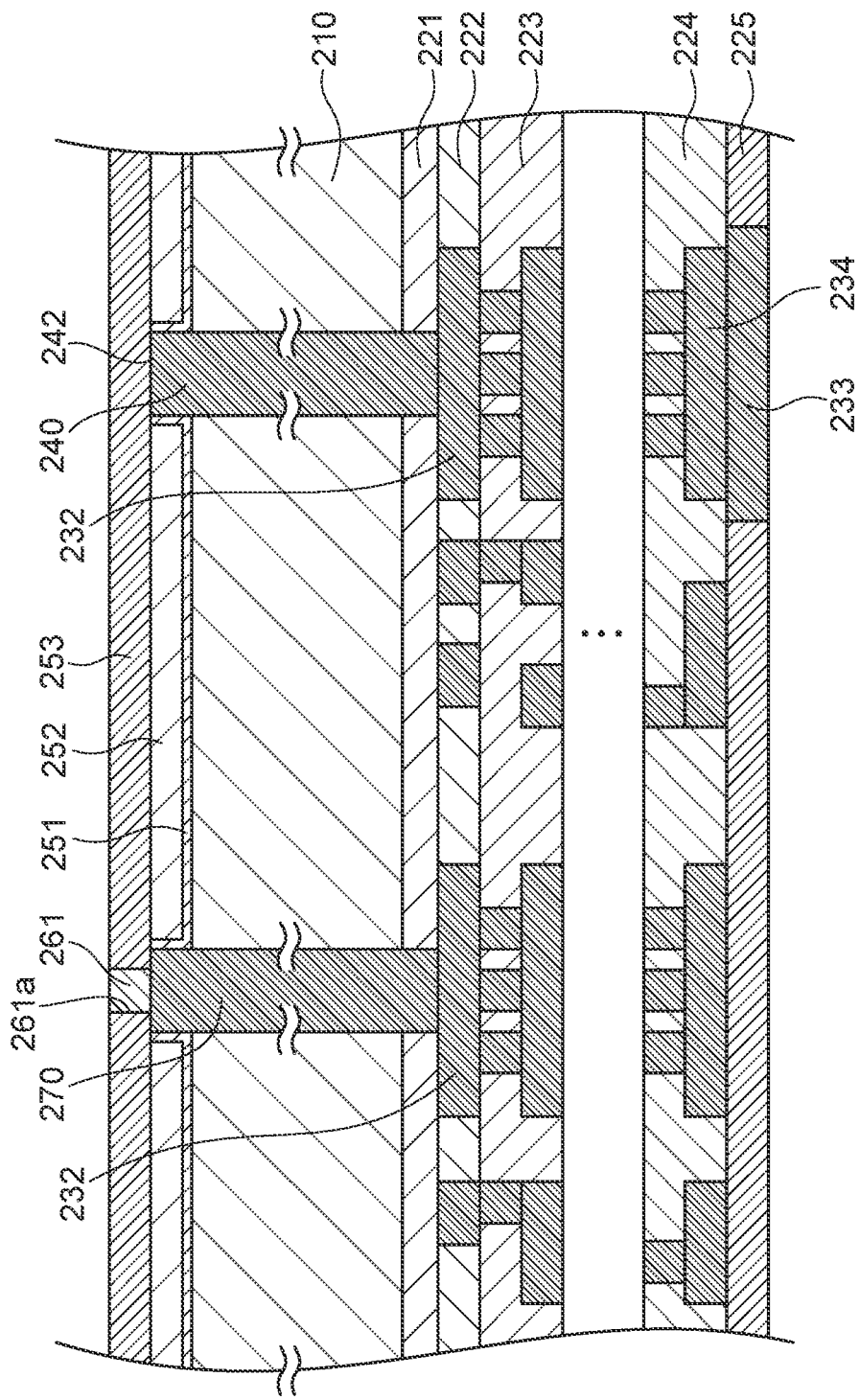

Next, as shown in FIG. 26, the silicon oxide film 252 is flattened by CMP. In this polishing, the lower ends 242 and 272 of the TSVs 240 and 270 are also polished, so that copper forming the TSVs 240 and 270 is exposed. Next, as shown in FIG. 27, the insulating film 253 mainly formed by a silicon oxide film is provided to cover the entire silicon oxide film 252 including the lower ends 242 and 272 of the TSVs 240 and 270, and is further subjected to thy etching using photoresist as a mask. Consequently, an opening 261a that reaches the TSV 270 is formed in the insulating film 253. After the photoresist is removed, a barrier layer made of titanium nitride, for example, is deposited by sputtering to cover the inside of the opening 261a and a surface of the insulating film 253, and tungsten is further deposited by CVD or PVD, so that the opening 261a is embedded. Subsequently, tungsten and the barrier layer on the surface of the insulating film 253 are removed by CMP or dry etching, thereby forming the tungsten plug 261. Although only one tungsten plug 261 is shown in FIG. 27, two or more tungsten plugs may be formed. In a process of forming the tungsten plug 261, a RDL made of tungsten may be simultaneously formed, s necessary.

Figure 28:
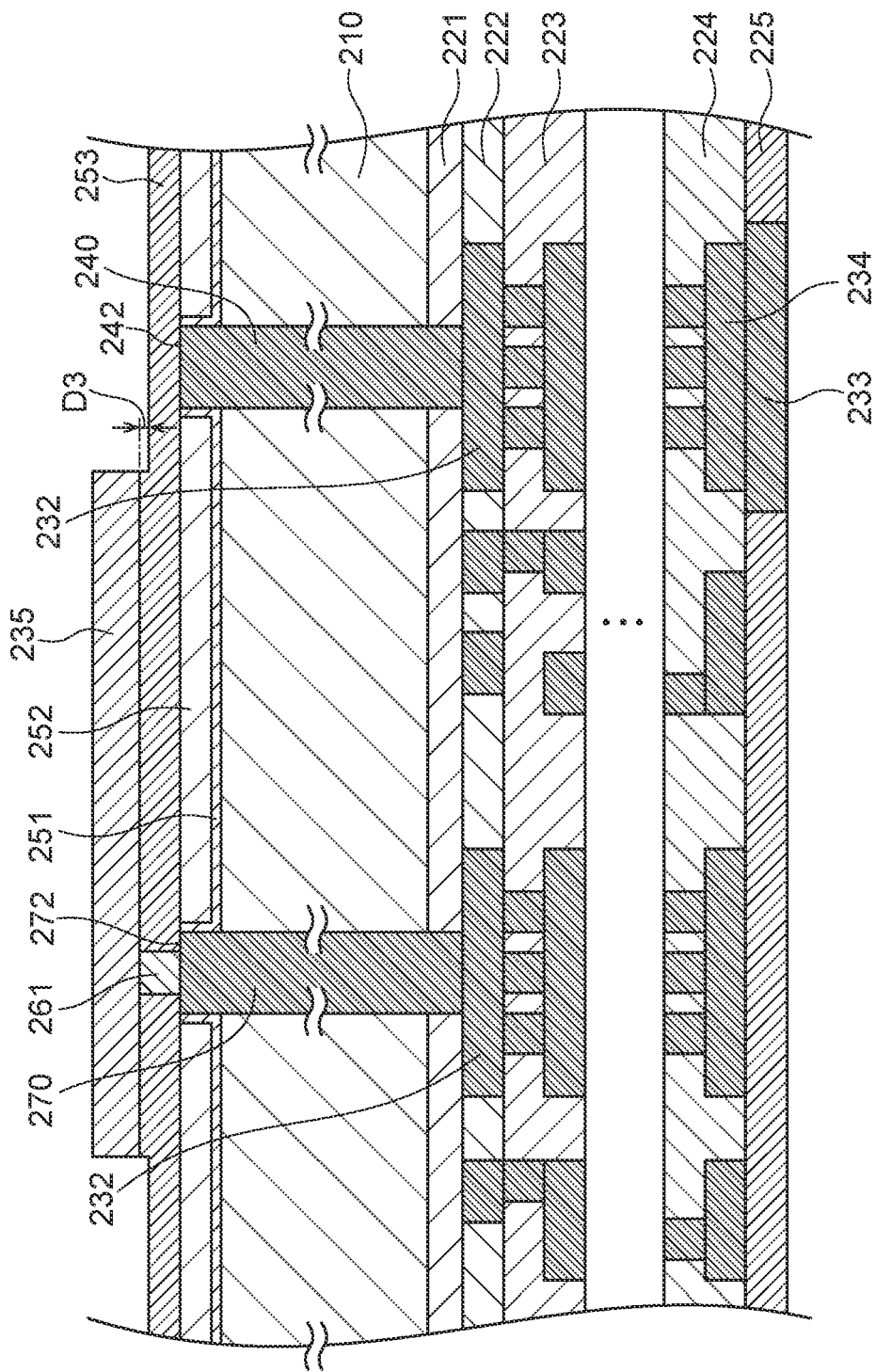

Next, as shown in FIG. 28, electrode materials are deposited by sputtering in the order of titanium, aluminum, and nitride, for example, on the surface of the insulating film 253 to be in contact with the tungsten plug 261, and thereafter dry etching using photoresist as a mask is performed. Consequently, a probe pad 235 is formed. Typically, the film thicknesses of titanium and titanium nitride are 5 to 30 nm and the film thickness of aluminum is 300 to 1500 nm. Chlorine gas such as $Cl_2$ or $BCl_3$, can be used in this dry etching. In this dry etching, overetching is performed in order to completely remove the electrode materials other than the probe pad 235, Therefore, the insulating film 253 has a step D3 of several tens of nanometers at a boundary between a portion overlapping the probe pad 235 and a portion not overlapping the probe pad 235. Next, a probe of a tester is brought in contact with the probe pad 253, and the semiconductor device 200 is tested. As described above, in the present embodiment, the semiconductor device 200 is tested by probing from the rear surface 212 side of the silicon substrate 210.

Figure 29:
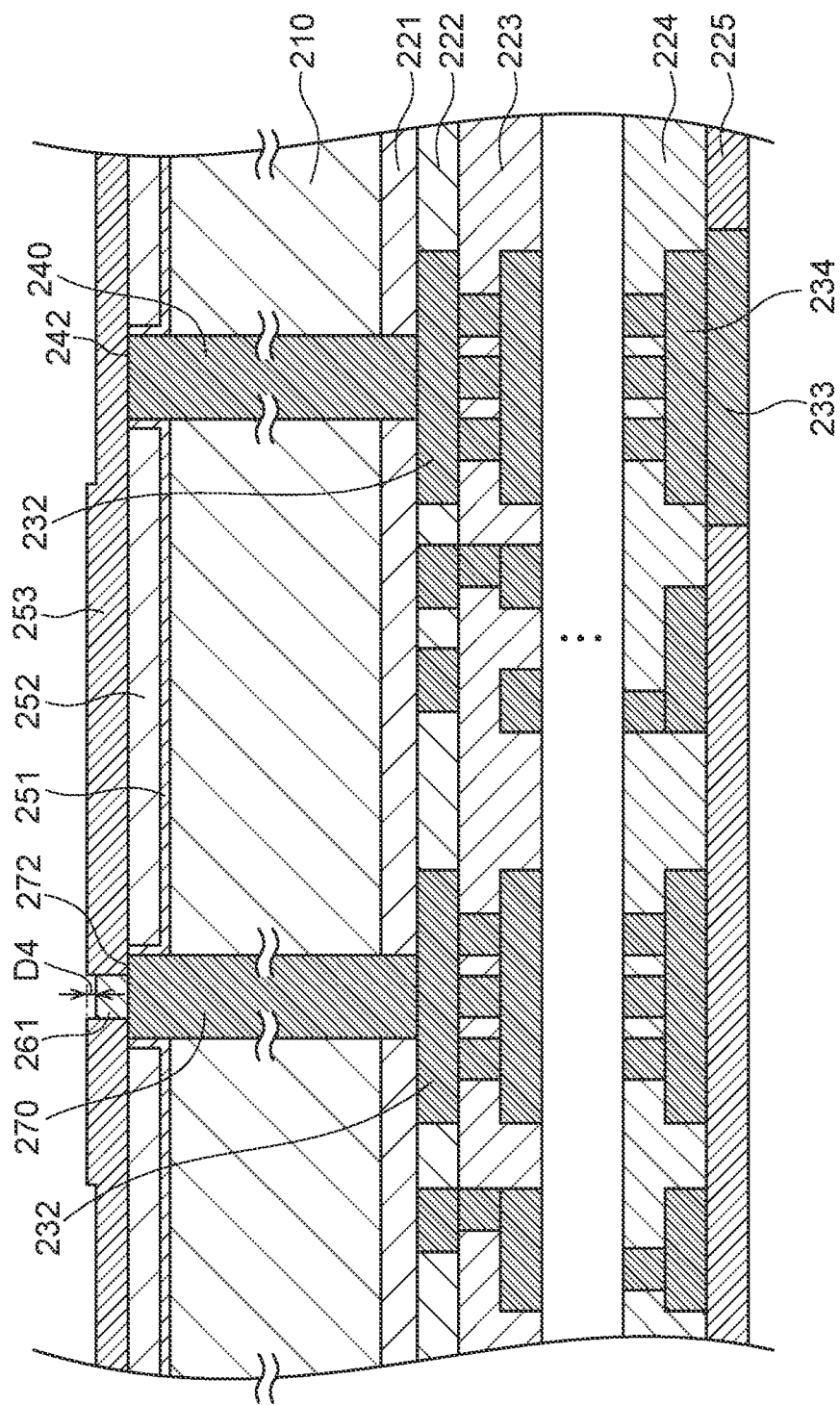
Figure 30:
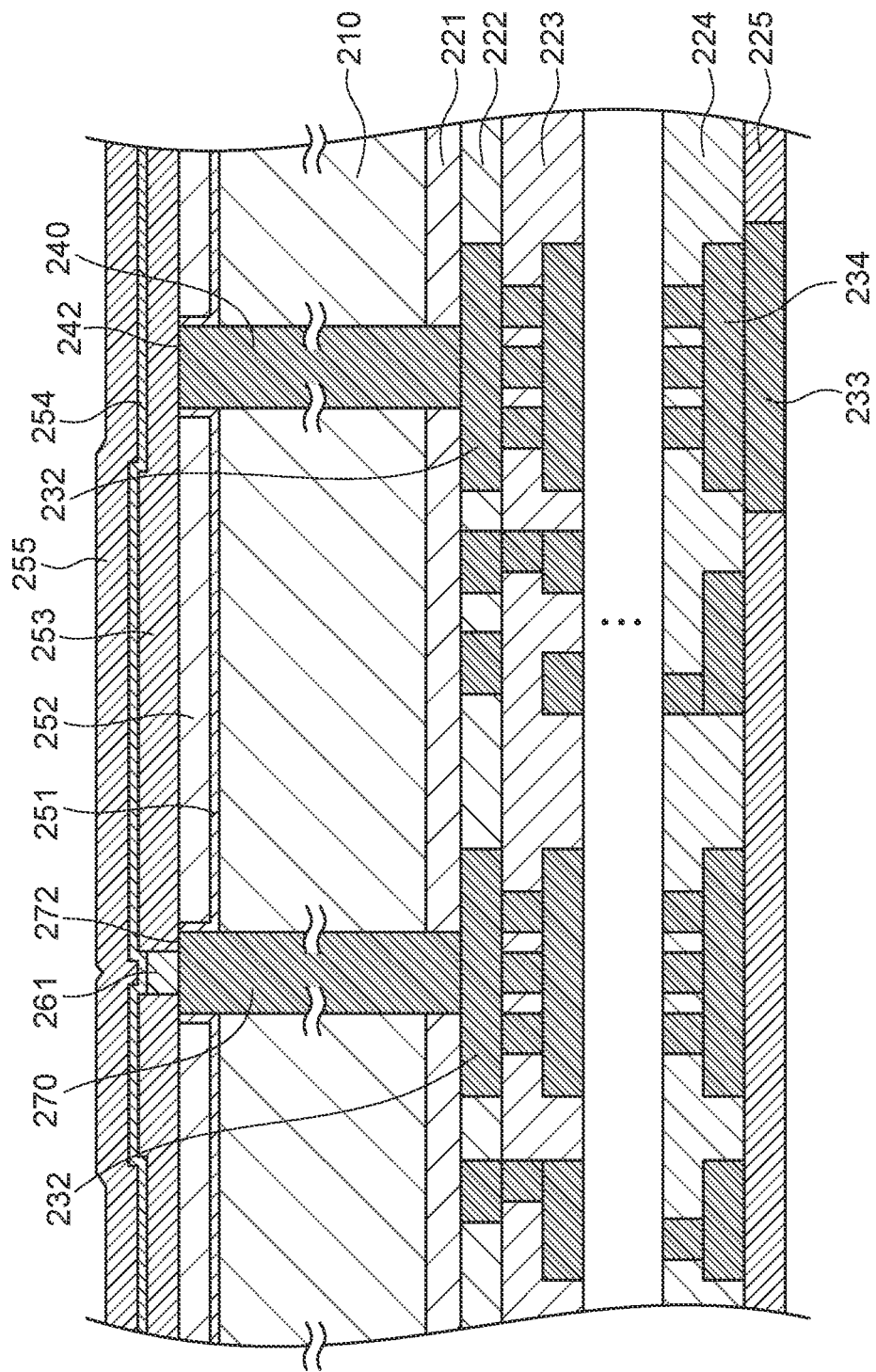
Figure 31:
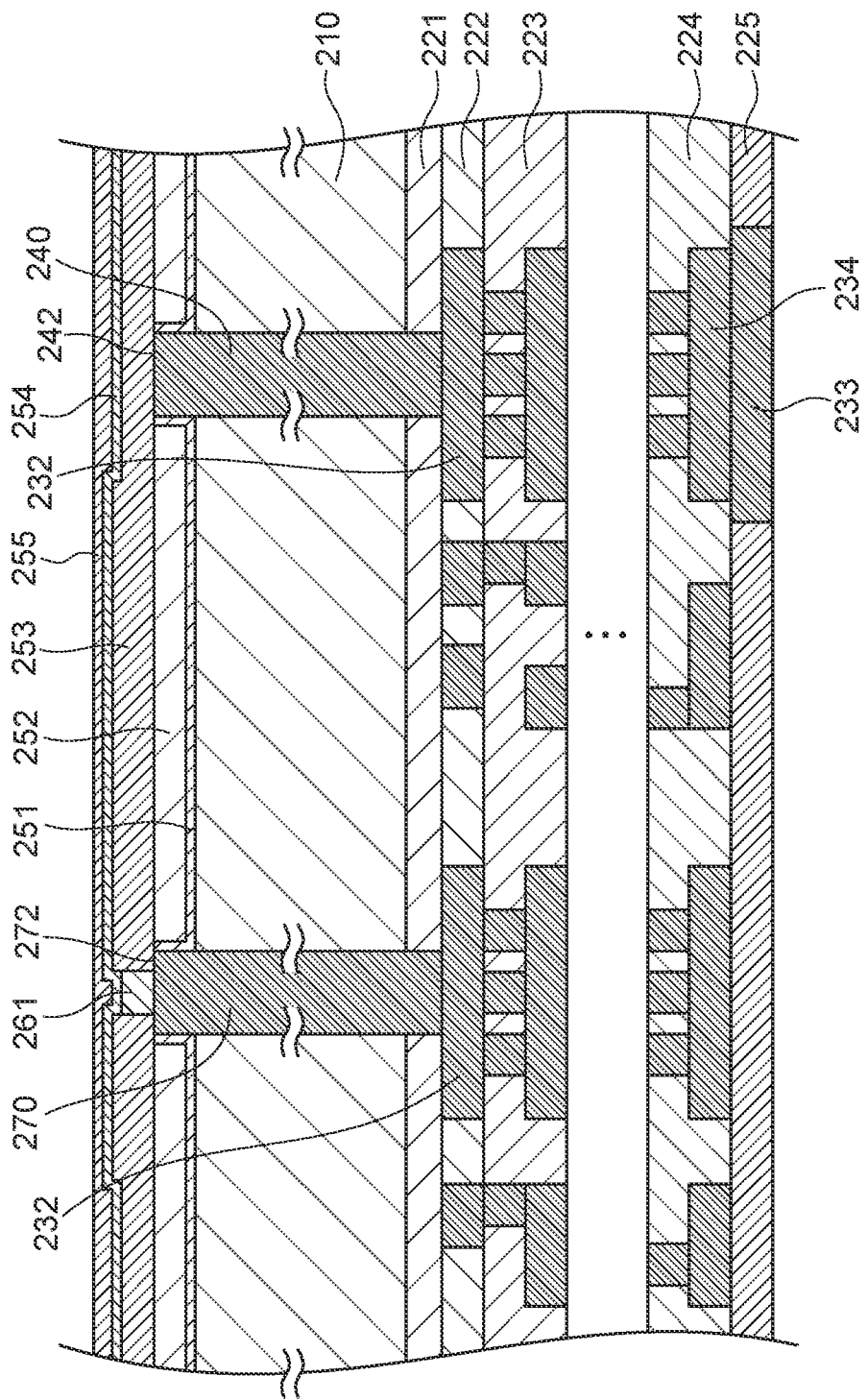
Figure 32:
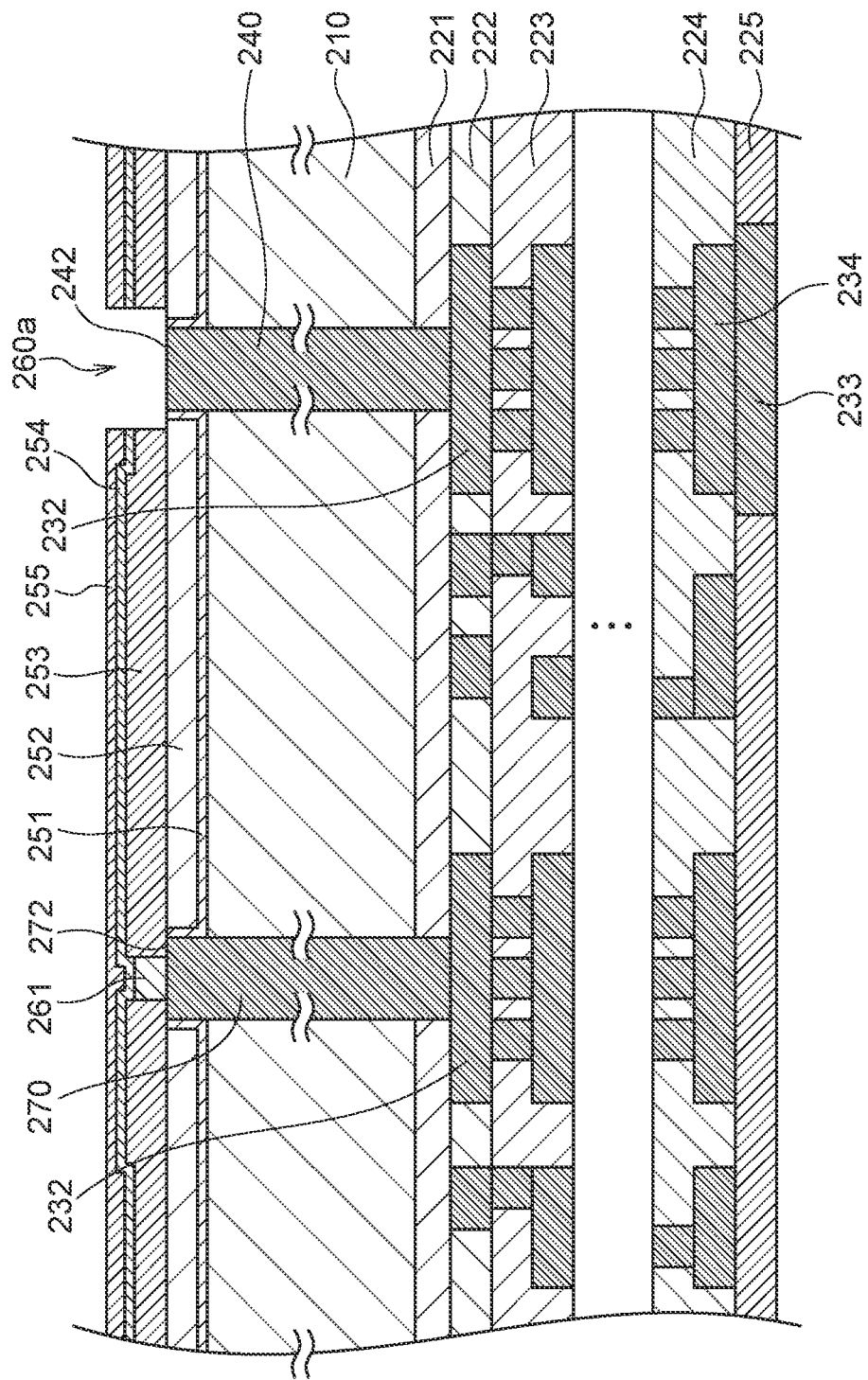

Next, as shown in FIG. 29, dry etching using chlorine gas such as $Cl_2$ or $BCl_3$, is performed for the entire surface of the insulating film 253 without using a mask, thereby removing the probe pad 235. Consequently, the tungsten plug 261 is exposed. In this etching, overetching is performed in order to completely remove the probe pad 235. Accordingly, the surface of the tungsten plug 261 is slightly etched by overetching for the probe pad 235 and the subsequent cleaning process, so that a step D4 of several tens of nanometers is formed. As a result, the insulating film 253 includes an area surrounding the tungsten plug 261 and further includes another area surround the area surrounding the tungsten plug 261. The area surrounding the tungsten plug 261 has a thickness that is greater than the other area. Additionally, the thickness of the area of the silicon oxide film 253 surrounding the tungsten plug 261 is greater than a thickness of the tungsten plug 261. Next, as shown in FIG. 30, the silicon nitride film 254 is formed by CVD to entirely cover the surface of the insulating film 253. The film thickness of the silicon nitride film 254 is typically 5 to 50 nm, Subsequently, the insulating film 255 mainly formed by a silicon oxide film is deposited by CVD to entirely cover a surface of the silicon nitride film 254. The film thickness of the insulating film 255 is typically 300 to 1000 nm. Since the insulating film 255 is deposited to follow the underlying steps D3 and D4, a small step remains in its surface. Next, as shown in FIG. 31, an upper portion of the insulating film 255 is removed by CMP, so that a flat surface is obtained. As a result, an upper surface of the insulating film 253 is substantially flat at a boundary between the area surrounding the tungsten plug 261 and the other area (that surrounds the area surrounding the tungsten plug 261) of the silicon oxide film 253. The step D3 and/or step D4 are not reflected by the upper surface of the insulating film 253. In a case where the steps D3 and D4 are sufficiently small, this CMP may be omitted. Next, as shown in FIG. 32, dry etching is performed for the insulating film 255, the silicon nitride film 254, and the insulating film 253 by using photoresist as a mask, thereby forming an opening 260a through which the lower end 242 of the TSV 240 is exposed. Fluorine gas can be used in this dry etching.

Next, tantalum and copper are deposited by sputtering in turn to cover a surface of the insulating film 255 and the inside of the opening 260a. The film thicknesses of tantalum and copper are typically 5 to 10 nm and 30 to 100 nm, respectively. Further, copper is deposited by electroplating to completely fill the opening 260a. Subsequently, the pad electrode 260 for connection shown in FIG. 18 is formed by removing unnecessary copper on the surface of the insulating film 255 by CMP, and the semiconductor device 200 according to the present embodiment is thus completed. The dual damascene method may be used for forming the pad electrode 260. Further, in the process of forming the pad electrode 260 by the damascene process, a RDL may be simultaneously formed on the rear surface 212 of the silicon substrate 210, as necessary.

Figure 19:
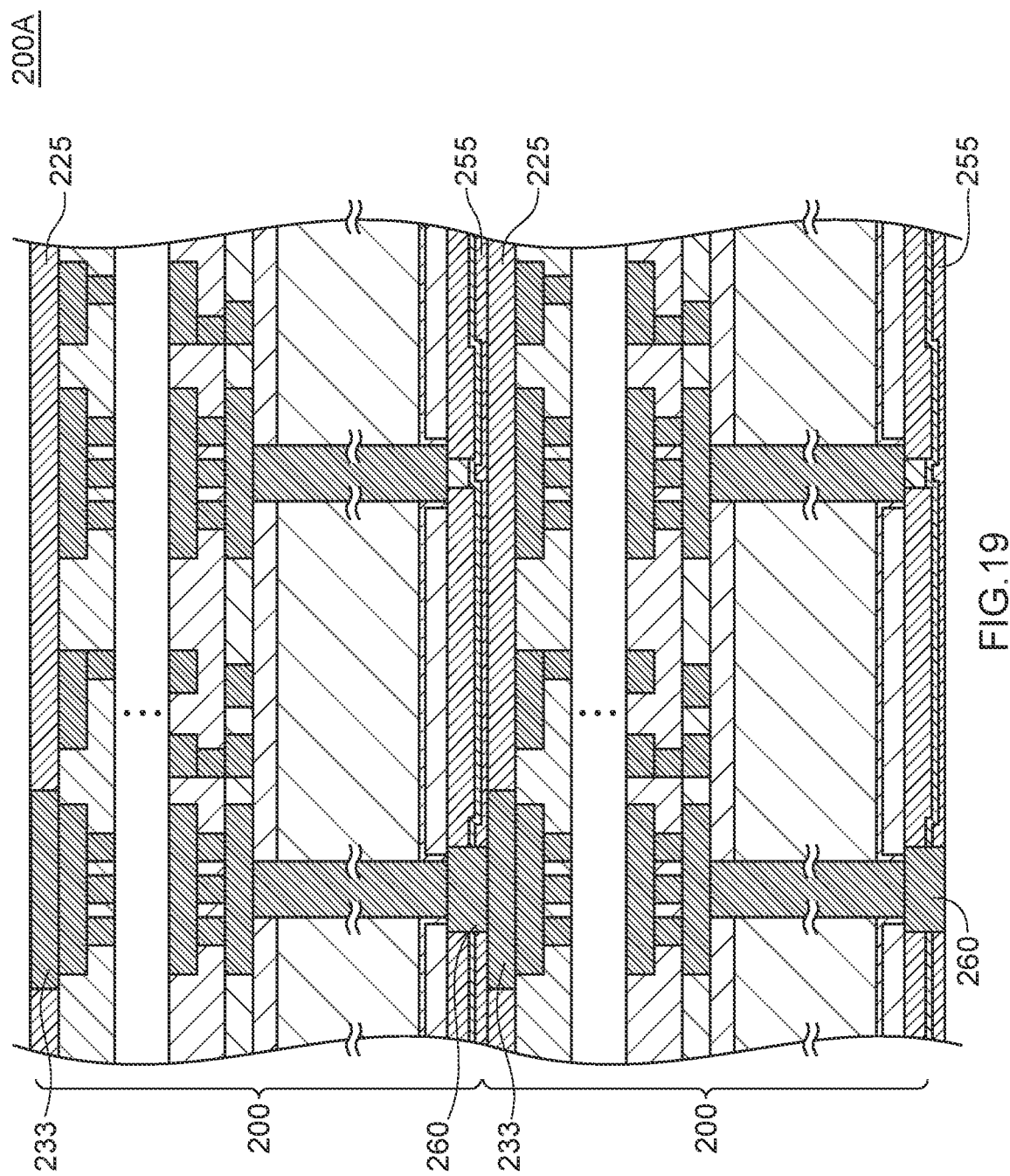
FIG. 19 is a schematic cross-section of a stacked semiconductor device in which semiconductor devices according to the second embodiment are stacked.

The stacked semiconductor device 200A can be configured by stacking a plurality of semiconductor devices 200 produced in the above-described manner by hybrid bonding as shown in FIG. 19. As described above, the semiconductor device 200 according to the present embodiment can obtain identical advantageous effects to those of the semiconductor device 100 according to the first embodiment.

Each of the semiconductor devices 100 and 200 described above can be applied to CoC (chip on chip), CoS (chip on substrate), and CoW (chip on wafer) in which one chip or both chips are stacked in the form of individual chip or chips, and can be also applied to WoW (wafer on wafer) in which both chips are stacked before being singulated. In WoW, since stacking is performed irrespective of whether each chip is defective, the following method can be performed. That is, when n wafers are stacked, the first to (n–1)-th wafers are stacked in a face down method with the probe pad 235 omitted therefrom, and the probe pad 235 shown in FIG. 28 is formed only on the n-th wafer. After a probe is brought into contact with the probe pad 235 and an operation test is performed, the probe pad 235 is removed as shown in FIG. 29, and the pad electrode 260 for connection is provided. Further, a CAP wafer in which only a connection pad is formed is stacked on the n-th wafer. Although a silicon substrate is made thin and then stacked in stacking of WoW in the above example, it is possible that stacking is performed while only a front-surface side pad is formed and thereafter the silicon substrate is made thin and a back-surface side pad is provided.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a semiconductor substrate;
   a plurality of interlayer insulating films on the semiconductor substrate; and
   a plurality of conductive patterns embedded in the interlayer insulating films,
   wherein the plurality of conductive patterns includes first and second conductive patterns embedded in uppermost ones of the plurality of interlayer insulating films,
   wherein the plurality of conductive patterns further includes a third conductive pattern embedded in another one of the plurality of interlayer insulating films adjacent to the uppermost ones of the plurality of interlayer insulating films,
   wherein the uppermost ones of the plurality of interlayer insulating films includes first and second insulating films,
   wherein the first and second insulating films are made of different materials,
   wherein the first conductive pattern has an upper surface that is exposed from the uppermost one of the plurality of interlayer insulating films,
   wherein the second insulating layer is on an upper surface of the second conductive pattern and the second conductive pattern is not exposed,
   wherein a lower surface of the first conductive pattern is substantially coplanar with a lower surface of the second conductive pattern, and
   wherein the lower surface of the second conductive pattern contacts with an upper surface of the third conductive pattern.

2. The apparatus of claim 1, wherein the upper surface of the first conductive pattern is substantially coplanar with an upper surface of the uppermost ones of the plurality of interlayer insulating films.

3. The apparatus of claim 1,
   wherein the second conductive pattern is electrically isolated from any of the plurality of conductive patterns other than the third conductive pattern.

4. The apparatus of claim 3, wherein the second conductive pattern is made of different material from the third conductive pattern.

5. The apparatus of claim 4, wherein the second conductive pattern is made of different material from the first conductive pattern.

6. The apparatus of claim 3, wherein an entire side surface of the second conductive pattern is in contact with the first insulating film.

7. The apparatus of claim 1, further comprising a TSV penetrating the semiconductor substrate,
   wherein the TSV overlaps the first conductive pattern.

8. The apparatus of claim 1, wherein the first insulating film is greater in thickness than the second insulating film.

9. The apparatus of claim 1, wherein the plurality of conductive patterns further includes a fourth conductive pattern embedded in the other one of the plurality the bottom surface of the first conductive pattern is in contact with a fourth conductive pattern disposed in the other interlayer insulating film.

10. An apparatus comprising:
    a semiconductor substrate;
    a plurality of interlayer insulating films on the semiconductor substrate; and
    a plurality of conductive patterns embedded in the interlayer insulating films,
    wherein the plurality of conductive patterns includes first and second conductive patterns embedded in an uppermost one of the plurality of interlayer insulating films,
    wherein the first conductive pattern has an upper surface that is exposed from the uppermost one of the plurality of interlayer insulating films, and
    wherein the second conductive pattern has an upper surface that is covered with the uppermost one of the plurality of interlayer insulating films and the second conductive pattern is not exposed,
    wherein the uppermost one of the plurality of interlayer insulating films includes first and second insulating films,
    wherein the second conductive pattern has side surfaces covered with the first insulating film and an upper surface covered with the second insulating film, wherein the first insulating film has a first portion surrounding the second conductive pattern and a second portion surrounding the first portion, and wherein the first portion is greater in thickness than the second portion.

11. The apparatus of claim 10, wherein the first portion is greater in thickness than the second conductive pattern.

12. The apparatus of claim 10, wherein the uppermost one of the plurality of interlayer insulating films further includes a third insulating film on the second insulating film, and wherein an upper surface of the third insulating film is substantially flat at a boundary between the first and second portions.

13. An apparatus comprising:

a semiconductor substrate having front and rear surfaces, wherein the front and rear surfaces are opposite to one another;

a plurality of wiring layers formed on the front surface of the semiconductor substrate;

first and second TSV penetrating the semiconductor substrate;

a plurality of insulating films in contact with the rear surface of the semiconductor substrate; and first and second conductive patterns embedded in the plurality of insulating films, wherein the first conductive pattern has an upper surface connected to the first TSV and a lower surface that is exposed from the plurality of insulating films, wherein the second conductive pattern has an upper surface connected to the second TSV and a lower surface that is in contact with the plurality of insulating films and the second conductive pattern is not exposed, and wherein the plurality of insulating films includes a first insulating film entirely covering a side surface of the second conductive pattern and a second insulating film in contact with the lower surface of the second conductive pattern, wherein the first insulating film and the second insulating film are made of different materials.

14. The apparatus of claim 13, wherein the lower surface of the first conductive pattern is substantially coplanar with a lower surface of the plurality of insulating films.

15. The apparatus of claim 13, wherein the plurality of wiring layers include a third conductive pattern located at an uppermost one of the plurality of wiring layers, wherein an upper surface of the third conductive layer is exposed, and wherein the third conductive pattern overlaps the first conductive pattern.

16. An apparatus comprising:

a semiconductor substrate having front and rear surfaces;

a plurality of wiring layers formed on the front surface of the semiconductor substrate;

first and second TSV penetrating the semiconductor substrate;

an insulating film covering the rear surface of the semiconductor substrate; and first and second conductive patterns embedded in the insulating film, wherein the first conductive pattern has an upper surface connected to the first TSV and a lower surface that is exposed from the insulating film, and wherein the second conductive pattern has an upper surface connected to the second TSV and a lower surface that is covered with the insulating film which is not exposed, wherein the insulating film includes a first insulating film covering side surfaces of the second conductive pattern and a second insulating film covering the lower surface of the second conductive pattern, wherein the first insulating film has a first portion surrounding the second conductive pattern and a second portion surrounding the first portion, and wherein the first portion is greater in thickness than the second portion.

17. The apparatus of claim 16, wherein the first portion is greater in thickness than the second conductive pattern.

* * * * *